(12) United States Patent
Umeda et al.

(10) Patent No.: US 11,422,288 B2
(45) Date of Patent: *Aug. 23, 2022

(54) LAMINATED FILM AND METHOD FOR PRODUCING LAMINATED FILM

(71) Applicant: FUJIFILM Corporation, Tokyo (JP)

(72) Inventors: Kenichi Umeda, Kanagawa (JP); Yuichiro Itai, Kanagawa (JP); Seigo Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 148 days.

This patent is subject to a terminal disclaimer.

(21) Appl. No.: 16/799,782

(22) Filed: Feb. 24, 2020

(65) Prior Publication Data

US 2020/0209433 A1 Jul. 2, 2020

Related U.S. Application Data

(63) Continuation of application No. PCT/JP2018/029840, filed on Aug. 8, 2018.

(30) Foreign Application Priority Data

Aug. 29, 2017 (JP) .............................. JP2017-164651

(51) Int. Cl.
*G02B 1/10* (2015.01)
*C23C 14/20* (2006.01)
(Continued)

(52) U.S. Cl.
CPC ............ *G02B 1/10* (2013.01); *C23C 14/205* (2013.01); *C23C 14/34* (2013.01); *C23C 16/345* (2013.01); *G02B 1/111* (2013.01)

(58) Field of Classification Search
None
See application file for complete search history.

(56) References Cited

U.S. PATENT DOCUMENTS 6,391,462 B1 5/2002 Jang
8,206,833 B2 6/2012 Ohmi et al.
(Continued)

FOREIGN PATENT DOCUMENTS

CN 101198726 6/2008
CN 101536608 9/2009
(Continued)

OTHER PUBLICATIONS

"Office Action of China Counterpart Application", dated Dec. 8, 2021, with English translation thereof, p. 1-p. 14.
(Continued)

*Primary Examiner* — Ramsey Zacharia
(74) *Attorney, Agent, or Firm* — JCIPRNET

(57) ABSTRACT

In a laminated film, a resin substrate, an organic/inorganic multilayer, and a silver-containing metal layer having a thickness of 20 nm or less are laminated in this order, an anchor metal diffusion control layer having a Hamaker constant of $7.3 \times 10^{-20}$ J or more is provided on the surface of the inorganic layer, an anchor region containing an oxide of an anchor metal having a surface energy which has a smaller difference with a surface energy of the silver-containing metal layer than a surface energy of the anchor metal diffusion control layer is provided between the anchor metal diffusion control layer and the silver-containing metal layer, and a cap region containing an oxide of the anchor metal is provided on a surface of the silver-containing metal layer that is opposite from a surface on a side closer to the anchor metal diffusion control layer.

11 Claims, 11 Drawing Sheets

(51) Int. Cl.

| | |
|---|---|
| *C23C 14/34* | (2006.01) |
| *C23C 16/34* | (2006.01) |
| *G02B 1/111* | (2015.01) |
| *C23C 14/02* | (2006.01) |
| *B32B 7/04* | (2019.01) |
| *B32B 9/00* | (2006.01) |
| *B32B 15/04* | (2006.01) |
| *C23C 14/08* | (2006.01) |

(56) References Cited

U.S. PATENT DOCUMENTS

| | | | |
|---|---|---|---|
| 9,476,137 B2 | 10/2016 | Ohmi et al. | |
| 10,641,927 B2 * | 5/2020 | Sonoda | B32B 15/018 |
| 2007/0207327 A1 | 9/2007 | Glenn et al. | |
| 2016/0372710 A1 | 12/2016 | Iwase et al. | |
| 2018/0040393 A1 | 2/2018 | Fujino et al. | |
| 2018/0095192 A1 | 4/2018 | Sonoda et al. | |

FOREIGN PATENT DOCUMENTS

| | | | |
|---|---|---|---|
| CN | 106103084 | 11/2016 | |
| CN | 106794670 | 5/2017 | |
| JP | H09291355 | 11/1997 | |
| JP | 2000062083 | 2/2000 | |
| JP | 2000071375 | 3/2000 | |
| JP | 2003255105 | 9/2003 | |
| JP | 2006154572 | 6/2006 | |
| JP | 2006184849 | 7/2006 | |
| JP | 2007041438 | 2/2007 | |
| JP | 2009298135 | 12/2009 | |
| JP | 2014065260 | 4/2014 | |
| JP | 2016219254 | 12/2016 | |
| WO | WO-2015141242 A1 * | 9/2015 | B32B 27/18 |
| WO | 2016189848 | 12/2016 | |

OTHER PUBLICATIONS

Dai Da-Huang et al., "Functional Thin Films and Deposition Technology," Metallurgical Industry Press, Jan. 2013, with concise explanation of relevance from English translation of the Second Office Action, pp. 1-13.

"Office Action of Japan Counterpart Application", dated Jul. 7, 2020, with English translation thereof, p. 1-p. 6.

"International Search Report (Form PCT/ISA/210) of PCT/JP2018/029840," dated Oct. 16, 2018, with English translation thereof, pp. 1-5.

"Written Opinion of the International Searching Authority (Form PCT/ISA/237) of PCT/JP2018/029840," dated Oct. 16, 2018, with English translation thereof, pp. 1-8.

"Office Action of China Counterpart Application", dated May 24, 2021, with English translation thereof, pp. 1-15.

"Examiner's Decision of Refusal of China Counterpart Application" with English translation thereof, dated Apr. 26, 2022, p. 1-p. 12.

* cited by examiner

LAMINATED FILM AND METHOD FOR PRODUCING LAMINATED FILM

CROSS-REFERENCE TO RELATED APPLICATIONS

This application is a continuation application of International Application No. PCT/JP2018/029840, filed Aug. 8, 2018, the disclosure of which is incorporated herein by reference in its entirety. Further, this application claims priority from Japanese Patent Application No. 2017-164651, filed Aug. 29, 2017, the disclosure of which is incorporated herein by reference in its entirety.

BACKGROUND OF THE INVENTION

1. Field of the Invention

The present invention relates to a laminated film applicable as an antireflection film, a transparent conductive film, and the like, and a method for producing the same.

2. Description of the Related Art

A transparent conductive film including a metal thin film layer containing silver as a main component on a resin substrate, a transparent conductive film including a conductive layer containing silver via a gas barrier film on a resin substrate, and the like are known (see JP2000-062083A (hereinafter, referred to as Patent Document 1), JP2016-219254A (hereinafter, referred to as Patent Document 2), and the like).

In order to improve transparency, the metal layer which is a conductive layer is preferably thin, and Patent Document 2 describes that an underlayer is effective for forming a flat thin film layer.

In addition, as a laminated film including a metal thin film layer containing silver, JP2006-184849A (hereinafter, referred to as Patent Document 3) discloses an antireflection laminate having a conductive antireflection layer in which a high refractive index transparent thin film layer and a metal thin film layer are alternately provided on a transparent substrate, and a low refractive index transparent thin film layer in contact with the outermost high refractive index transparent thin film layer. Patent Document 3 discloses that as a layer for protecting from corrosion, a protective layer may be provided for upper and lower layers of the metal thin film. For the protective layer, metals such as zinc, silicon, nickel, chromium, gold, and platinum, alloys thereof, and oxides, fluorides, sulfides and nitrides of these metals may be used.

JP2003-255105A (hereinafter, referred to as Patent Document 4) discloses an antireflection film that is formed by laminating a metal thin film layer and a metal oxide thin film layer on a substrate, in which an underlayer is provided between the substrate and the metal thin film layer in order to stabilize the metal thin film layer, and an interlayer is provided between the metal thin film layer and the metal oxide thin film layer. As the underlayer and the interlayer, metal thin film layers of silicon, titanium, and the like may be used.

SUMMARY OF THE INVENTION

As described in Patent Documents 1 and 2, it is expected for a laminated film including a metal thin film layer on a resin substrate to be developed not only as a transparent conductive film but also for various applications. However, it is very difficult to form a very thin and flat metal layer on a resin substrate. Particularly, as in Patent Document 2, in a case where a metal layer is formed on a resin substrate through a gas barrier film, it is clear that there arises a problem of the occurrence of peeling caused by defects present in a barrier film. In Patent Document 2, it is proposed to provide an underlayer to secure the flatness of the metal layer, but a measurement for suppressing peeling is not disclosed.

The present disclosure has been made in consideration of the above circumstances and an object thereof is to provide a laminated film having high adhesiveness including an ultrathin metal layer having high flatness on a resin substrate and a method for producing the same.

According to the present invention, there is provided a laminated film comprising: a resin substrate; an organic/inorganic multilayer in which an organic layer and an inorganic layer are alternately laminated; and a silver-containing metal layer having a thickness of 20 nm or less, in which the resin substrate, the organic/inorganic multilayer, and the silver-containing metal layer are laminated in this order, a layer of the organic/inorganic multilayer on a side closest to the silver-containing metal layer is an inorganic layer, an anchor metal diffusion control layer having a Hamaker constant of $7.3 \times 10^{-20}$ J or more is provided on a surface of the inorganic layer, an anchor region containing an oxide of an anchor metal having a surface energy which has a smaller difference with a surface energy of the silver-containing metal layer than a surface energy of the anchor metal diffusion control layer is provided between the anchor metal diffusion control layer and the silver-containing metal layer, and a cap region containing an oxide of the anchor metal is provided on a surface of the silver-containing metal layer that is opposite from a surface on a side closer to the anchor metal diffusion control layer.

Here, the expression "containing silver" means that the content of silver included in the silver-containing metal layer is 50 atomic % or more.

In addition, the anchor metal used herein refers to a metal of which, in a case where a layer is formed of the metal, the surface energy has a smaller difference with the surface energy of the silver-containing metal layer than with the surface energy of the anchor metal diffusion control layer.

In the laminated film according to the present disclosure, it is preferable that the anchor metal diffusion control layer includes a metal oxide, a metal nitride, a metal oxynitride or a metal carbide.

In the laminated film according to the present disclosure, it is preferable that the anchor metal diffusion control layer contains a Hf oxide.

Here, the expression "contains a Hf oxide" means that the content of Hf oxide in the anchor metal diffusion control layer 20% by mole or more. It is more preferable that the occupancy ratio of Hf oxide in the anchor metal diffusion control layer is 50% by mole or more, and it is particularly preferable that the anchor metal diffusion control layer is constituted of only a Hf oxide (the occupancy ratio is 100%). The Hf oxide may include an oxygen defect, and in a case where the Hf oxide is expressed as $HfO_{2-x}$, X is preferably in a range of 0 to 1.5. In the following description, the Hf oxide is expressed as $HfO_2$ including a case where the Hf oxide includes an oxygen defect.

In the laminated film according to the present disclosure, it is preferable that in the anchor region, a content ratio of the oxide of the anchor metal is larger than a content ratio of a non-oxidized anchor metal.

In the laminated film according to the present disclosure, it is preferable that the anchor metal is Ge, Si, Sn, In, Ga, Cu, or Zn.

In the laminated film according to the present disclosure, the silver-containing metal layer may have a thickness of 10 nm or less.

In the laminated film according to the present disclosure, it is preferable that the organic/inorganic multilayer is a gas barrier layer.

According to the present disclosure, there is provided a method for producing a laminated film including a resin substrate, an organic/inorganic multilayer in which an organic layer and an inorganic layer are alternately laminated, an anchor metal diffusion control layer, and a silver-containing metal layer having a thickness of 20 nm or less, which are laminated in this order, the method comprising:

preparing a film in which an organic/inorganic multilayer whose outermost surface is an inorganic layer, serving as the organic/inorganic multilayer, is provided on the resin substrate;

forming an anchor metal diffusion control layer having a Hamaker constant of $7.3 \times 10^{-20}$ J or more on the outermost surface;

forming an anchor metal layer formed of an anchor metal having a surface energy which has a smaller difference with a surface energy of the silver-containing metal layer than a surface energy of the anchor metal diffusion control layer on the anchor metal diffusion control layer;

forming the silver-containing metal layer on the anchor metal layer;

exposing a laminate in which the organic/inorganic multilayer, the anchor metal diffusion control layer, the anchor metal layer, and the silver-containing metal layer are laminated on the resin substrate to a water vapor atmosphere and performing oxidation treatment of the anchor metal using oxygen molecules and water as reactive species; and producing a laminated film including an anchor region containing an oxide of the anchor metal between the anchor metal diffusion control layer and the silver-containing metal layer, and a cap region containing an oxide of the anchor metal on a surface of the silver-containing metal layer that is opposite from the anchor metal diffusion control layer.

In the present specification, the water vapor atmosphere means that the water vapor amount is 50 g/m$^3$ or more. Oxygen molecules and water used as reactive species are contained in the water vapor atmosphere.

In the method for producing a laminated film according to the present disclosure, it is preferable that a water vapor amount in the water vapor atmosphere is 100 g/m$^3$ or more.

In the method for producing a laminated film according to the present disclosure, it is preferable that a temperature of the water vapor atmosphere is 100° C. or lower.

In a laminated film according to the present disclosure, a resin substrate, an organic/inorganic multilayer in which an organic layer and an inorganic layer are alternately laminated; and a silver-containing metal layer having a thickness of 20 nm or less are laminated in this order, a layer of the organic/inorganic multilayer on a side closest to the silver-containing metal layer is an inorganic layer, an anchor metal diffusion control layer having a Hamaker constant of $7.3 \times 10^{-20}$ J or more is provided on a surface of the inorganic layer, an anchor region containing an oxide of an anchor metal having a surface energy, which has a smaller difference with a surface energy of the silver-containing metal layer than a surface energy of the anchor metal diffusion control layer, is provided between the anchor metal diffusion control layer and the silver-containing metal layer, and a cap region containing an oxide of the anchor metal is provided on a surface of the silver-containing metal layer that is opposite from a surface on a side closer to the anchor metal diffusion control layer. According to the configuration, it is possible to realize a laminated film including an ultrathin metal layer having high flatness and having high adhesiveness.

DESCRIPTION OF THE PREFERRED EMBODIMENTS

Hereinafter, embodiments of the present invention will be described.

Figure 1:
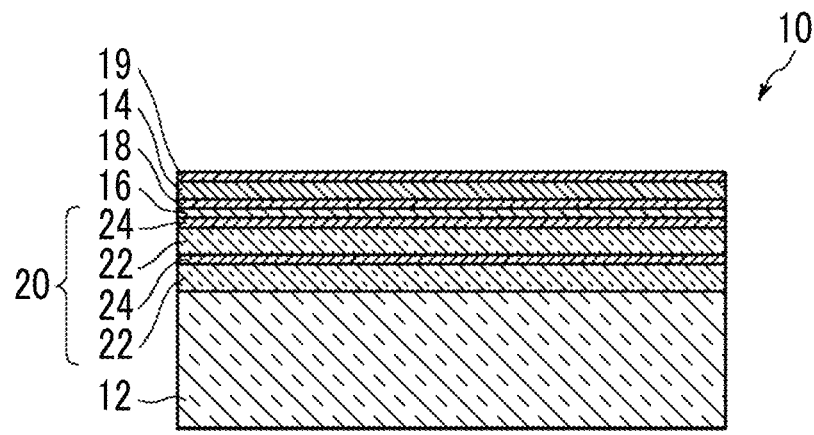
FIG. 1 is a schematic cross-sectional view showing a schematic configuration of a laminated film according to a first embodiment of the present invention.

FIG. 1 is a schematic cross-sectional view showing a schematic configuration of a laminated film 10 according to an embodiment of the present invention. As shown in FIG. 1, the laminated film 10 according to the embodiment is formed by laminating a resin substrate 12, an organic/inorganic multilayer 20 in which an organic layer 22 and an inorganic layer 24 are alternately laminated, and a silver-containing metal layer 14 containing silver (Ag). The laminated film 10 comprises an anchor metal diffusion control layer 16 having a Hamaker constant of $7.3 \times 10^{-20}$ J or more between the organic/inorganic multilayer 20 and the silver-containing metal layer 14. A layer of the organic/inorganic multilayer 20 on a side closest to the silver-containing metal layer 14 is the inorganic layer 24, and the anchor metal diffusion control layer 16 is provided on the inorganic layer 24. Further, the laminated film 10 comprises an anchor region 18 containing an oxide of an anchor metal between the anchor metal diffusion control layer 16 and the silver-containing metal layer 14 and a cap region 19 containing an oxide of an anchor metal on a surface of the silver-containing metal layer 14 that is opposite from the anchor metal diffusion control layer 16 including the anchor region 18.

Here, the anchor metal has a surface energy which has a smaller difference with the surface energy of the silver-containing metal layer than with the surface energy of the anchor metal diffusion control layer. Although the details will be described later, the anchor metal is a metal used as an underlayer for forming a flat silver-containing metal layer 14.

The resin substrate 12 is a flexible film formed of a resin and is preferably transparent from the viewpoint that the laminated film can be applied to various applications. In the present specification, the term "transparent" means that the internal transmittance is 10% or more with respect to light in a wavelength range of 400 nm to 800 nm (visible light).

The refractive index of the resin substrate 12 is not particularly limited and is preferably 1.45 or more. The refractive index of the resin substrate 12 may be 1.61 or more and 1.74 or more and further 1.84 or more. In the present specification, the refractive index indicates a refractive index with respect to light having a wavelength of 500 nm.

The resin substrate can be selected appropriately according to the purpose of use. Specific examples thereof include thermoplastic resins such as polyester resins, methacrylic resins, methacrylic acid-maleic acid copolymers, polystyrene resins, transparent fluoro resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloyl compounds.

The thickness of the resin substrate is preferably 10 μm to 250 μm and more preferably 20 μm to 130 μm.

The materials and functions of the organic layer and the inorganic layer constituting the organic/inorganic multilayer are not particularly limited and the layers are particularly preferably gas barrier layers.

The organic/inorganic multilayer includes at least one organic layer and at least one inorganic layer, and two or more organic layers and two or more inorganic layers may be alternately laminated. In a case of constituting a gas barrier layer, the number of layers is not particularly limited, but typically 2 to 30 layers are preferable, and 3 to 20 layers are more preferable. In addition, layers other than the organic layer and the inorganic layer may be included in the organic/inorganic multilayer.

The thickness of the organic/inorganic multilayer is preferably 0.5 μm to 10 μm and more preferably 1 μm to 5 μm.

Regarding a gas barrier layer formed of an organic/inorganic multilayer, for example, barrier laminates described in JP2010-200780A, JP2010-006064A, and JP2008-221830A, and a gas barrier layer described in JP2009-081122A can be referred to.

(Inorganic Layer)

The inorganic layer is usually a thin film layer formed of a metal compound. As a method for forming the inorganic layer, any method may be used as long as the method is a method capable of forming a desired thin film. Examples of the method include physical vapor deposition methods (PVD) such as a vapor deposition method, a sputtering method and an ion plating method, various chemical vapor deposition methods (CVD), and liquid phase growth methods such as plating and a sol-gel method. Components included in the inorganic layer are not particularly limited as long as the components satisfy the above performance. Examples thereof include a metal oxide, a metal nitride, a metal carbide, a metal oxynitride and a metal oxycarbide, and an oxide, a nitride, a carbide, an oxynitride, an oxycarbide or the like containing one or more metals selected from Si, Al, In, Sn, Zn, Ti, Cu, Ce, and Ta can be used preferably. Among these, an oxide, a nitride or an oxynitride of a metal selected from Si, Al, In, Sn, Zn, and Ti is preferable, and particularly, a metal oxide, nitride, or oxynitride of Si (silicon) or Al (aluminum) is preferable. These may contain another element as a subcomponent. For example, a nitride having a hydroxyl group or the like may be formed.

As the inorganic layer, particularly, inorganic layers including Si are preferable. This is because the inorganic layers have higher transparency and further excellent gas barrier properties. Among these, an inorganic layer formed of silicon nitride is particularly preferable.

The inorganic layer may contain hydrogen as appropriate by including, for example, a metal oxide, nitride or oxynitride containing hydrogen, but the hydrogen concentration in forward Rutherford scattering is preferably 30% or less.

The smoothness of the inorganic layer is preferably less than 3 nm and more preferably 1 nm or less as an average roughness in 1 μm square (Ra value).

The thickness of the inorganic layer is not particularly limited. Typically, the thickness of the single inorganic layer is in a range of 5 to 500 nm, preferably 10 to 200 nm, and more preferably 15 to 50 nm. The single inorganic layer may have a laminated structure including a plurality of sub-layers. In this case, the compositions of each sub-layer may be the same as or different from each other.

(Organic Layer)

The organic layer can be preferably formed by curing a polymerizable composition including a polymerizable compound.

The polymerizable compound used for forming the organic layer in the organic/inorganic multilayer is preferably a compound having an ethylenically unsaturated bond at the terminal or side chain thereof and/or a compound having epoxy or oxetane at the terminal or side chain. As the polymerizable compound, a compound having an ethylenically unsaturated bond at the terminal or side chain is particularly preferable. Examples of the compound having an ethylenically unsaturated bond at the terminal or side chain include a (meth)acrylate-based compound, an acrylamide-based compound, a styrene-based compound and maleic acid anhydride. A (meth)acrylate-based compound is preferable, and an acrylate-based compound is particularly preferable.

As the (meth)acrylate-based compound, (meth)acrylate, urethane (meth)acrylate, polyester (meth)acrylate, epoxy (meth)acrylate, or the like is preferable.

As the styrene-based compound, styrene, α-methylstyrene, 4-methylstyrene, divinylbenzene, 4-hydroxystyrene, 4-carboxystyrene, or the like is preferable.

As the (meth)acrylate-based compound, specifically, compounds described in paragraphs 0024 to 0036 of JP2013-043382A, and compounds described in paragraphs 0036 to 0048 of JP2013-043384A can be used. In addition, a polyfunctional acrylic monomer having a fluorene skeleton described in WO2013/047524 can be used.

The organic layer is preferably smooth and preferably has high film hardness. The smoothness of the organic layer is preferably less than 3 nm and more preferably less than 1 nm as an average roughness in 1 μm square (Ra value).

The thickness of the organic layer is not particularly limited and from the viewpoint of brittleness and light transmittance, is preferably 50 nm to 5000 nm, more preferably 200 nm to 3500 nm, and even more preferably 800 nm to 3000 nm.

The silver-containing metal layer 14 may be a layer formed of 50 atomic % or more of silver with respect to the constitutional elements. The silver-containing metal layer 14 may contain at least one of palladium (Pd), copper (Cu), gold (Au), neodymium (Nd), samarium (Sm), bismuth (Bi), platinum (Pt), tin (Sn), aluminum (Al), zinc (Zn), magnesium (Mg), indium (In), gallium (Ga), or lead (Pb), in addition to silver.

Specifically, for example, as the material forming the silver-containing metal layer 14, an Ag—Nd—Cu alloy, an Ag—Pd—Cu alloy, an Ag—Bi—Nd alloy, an Ag—Au alloy, or the like may be suitably used.

As the raw material for forming the silver-containing metal layer 14, a material in which 85 atomic % or more of the constitutional elements is silver is preferably used. In this case, the content of metal elements other than silver may be less than 15 atomic %, but is more preferably 5 atomic % or less and even more preferably 2 atomic % or less. In this case, the content refers to a total content of two or more metal elements in a case in which the metal layer contains two or more metal elements other than silver. From the viewpoint of preventing reflection, it is most preferable to use pure silver. On the other hand, from the viewpoint of flatness and durability of the silver-containing metal layer, the silver-containing metal layer preferably contains metal elements other than silver.

In the laminated film 10, the total film thickness of the anchor region 18, the silver-containing metal layer 14, and the cap region 19 is preferably 24 nm or less and more preferably 0.5 nm or more. The total film thickness is even more preferably 2.0 nm or more, still even more preferably 2.5 nm or more, and particularly preferably 3 nm or more. In the laminated film after production, the total film thickness including the anchor region 18, the silver-containing metal layer 14, and the cap region 19 can be obtained by X-ray reflectivity measurement. Specifically, for example, the film thickness can be obtained by measuring a signal near the critical angle using RIGAKU RINT ULTIMA III (CuK α-line at 40 kV and 40 mA), and extracting and fitting the obtained vibration component.

The thickness of the silver-containing metal layer 14 is 20 nm or less as a design film thickness, and preferably 10 nm or less. Since the thickness is very thin, it is difficult to accurately measure the film thickness of the silver-containing metal layer 14 itself in the laminated film. However, as long as the total film thickness of the anchor region 18, the silver-containing metal layer 14, and the cap region 19 is 24 nm or less, the silver-containing metal layer 14 may satisfy a thickness of 20 nm or less, and as long as the total film thickness is 21 nm or less, the silver-containing metal layer 14 can sufficiently satisfy a thickness of 20 nm or less.

The silver-containing metal layer 14 is preferably formed using a vapor phase film forming method such as vacuum deposition, plasma sputtering, electron cyclotron sputtering, or ion plating.

The anchor region 18 is a region which is provided for smoothly forming the silver-containing metal layer before the silver-containing metal layer 14 is laminated and formed by altering the anchor metal layer 17 (refer to the production method described later) formed of an anchor metal and having a thickness of 0.2 nm to 2 nm in the production process. That is, the anchor region 18 is formed at the interface region between the anchor metal diffusion control layer 16 and the silver-containing metal layer 14. Here, the alteration means that a state of the anchor metal layer becomes different from the state at the time of film formation by mixing with the constitutional elements of the anchor metal diffusion control layer 16 and/or the silver-containing metal layer 14, oxidation of the metal element, or the like.

Similarly, the cap region 19 is a region formed by moving the anchor metal constituting the anchor metal layer 17 to the surface of the silver-containing metal layer 14 through silver-containing metal layer 14 in the production process.

After the anchor metal layer 17 is altered into the anchor region 18 and the cap region 19, with the oxidation of the anchor metal, the total film thickness of both the regions 18 and 19 may be increased to about twice the film thickness of the anchor metal layer 17.

Accordingly, the atoms present in the silver-containing metal layer 14 and the anchor metal diffusion control layer 16 are mixed in the anchor region 18 in addition to the anchor metal and the oxide thereof, and the atoms present in the silver-containing metal layer 14 are mixed in the cap region 19 in addition to the anchor metal oxide. The anchor region 18 and the cap region 19 are regions in which in a case where the content of the anchor metal is measured in the depth direction (lamination direction), the content is about 1 nm or less around a position showing the peak (the position in the depth direction) in line profiles showing changes in the content at the position in the depth direction (refer to FIG. 9). In the line profiles of the anchor metals, two peaks are observed. Of the two peaks, one closer to the substrate is the peak of the anchor region and the other far from the substrate is the peak of the cap region.

As described above, the anchor metal layer formed of the anchor metal has a surface energy with a smaller difference with the surface energy of the silver-containing metal layer than with the surface energy of the anchor metal diffusion control layer. In the present specification, the surface energy is defined as a surface energy (surface tension) γ calculated using $\gamma = \gamma_0 + (t-t_0)(d\gamma/dt)$ from Metal Data Book, edited by The Japan Institute of Metals, version No. 4, p. 16.

Hereinafter, the surface energies of various metal elements at room temperature calculated by the above method are exemplified.

TABLE 1

| Element | Surface energy γ (mN/m) |
|---|---|
| Bi | 395.22 |
| Pb | 507.26 |
| Sn | 558.49 |
| In | 567.844 |
| Mg | 778.1 |
| Nd | 778.91 |
| Zn | 848.98 |
| Ge | 857.34 |
| Si | 1045.05 |
| Ag | 1052.712 |
| Al | 1136.25 |
| Mn | 1333.2 |
| Cu | 1422.54 |
| Au | 1679.76 |
| Pd | 1835.94 |
| Hf | 2032.78 |
| Ga | 718 |
| Ti | 2081.6 |

TABLE 1-continued

| Element | Surface energy γ (mN/m) |
| --- | --- |
| Cr | 2292 |
| Ir | 2317.983 |
| Ni | 2321.02 |
| Co | 2592.32 |
| Fe | 2612.39 |
| Ta | 2888 |
| Mo | 3024.6 |
| W | 3472.08 |

In a case where the silver-containing metal layer is a silver film, according to the above table, the surface energy is 1053 mN/m. In contrast, specifically, the anchor metal diffusion control layer includes a metal oxide, a metal nitride, a metal oxynitride or a metal carbide, and these generally have surface energy less than the surface energy of metal. For example, the surface energies of $TiO_2$, $HfO_2$, and $Ta_2O_5$ are respectively about 350 mN/m, 330 mN/m, and 280 mN/m, and a difference with the surface energy of the silver film is more than 700 mN/m.

In a case where an ultrathin film of silver is directly formed on a film, such as an oxide or nitride film, having a large difference with the surface energy of silver, a case where silver particles are bonded to each other is more stable than a case where the silver is bonded with the oxide or nitride. Thus, grain growth of the silver is promoted. Therefore, as the present inventors proceed with the investigation, it became clear that it is difficult to form a smooth ultrathin film. In order to obtain a smooth ultrathin silver film, it is effective to provide an anchor metal layer having a surface energy close to the surface energy of the silver film on the deposition surface of the silver film. By providing the anchor metal layer, the growth of crystal grains is suppressed in the silver-containing metal layer and thus a flat ultrathin film can be obtained.

As the anchor metal, among the metal elements exemplified in Table 1, an anchor metal can be appropriately selected from bismuth (Bi), lead (Pb), tin (Sn), indium (In), magnesium (Mg), neodymium (Nd), zinc (Zn), gallium (Ga), germanium (Ge), silicon (Si), aluminum (Al), manganese (Mn), copper (Cu) and gold (Au), and used according to the constitutional material of the anchor metal diffusion control layer, whose surface energy satisfies a range of about more than 350 mN/m and 1750 mN/m or less.

The surface energy of the anchor metal layer is preferably more than 350 mN/m and 1700 mN/m or less, and more preferably 500 mN/m or more. Accordingly, Pb, Sn, In, Mg, Zn, Ga, Si, Cu, Au, and Ge are preferable. According to the investigation of the present inventors, from the viewpoint of suppressing an increase in particle size of Ag, Cu, In, Ga, and Ge are preferable, and Ge is particularly preferable. The anchor metal may not be a single metal but may include two or more metals.

When the anchor metal layer is formed, an alloy layer formed of two or more metals may be formed and when the anchor metal layer is formed, a plurality of layers formed of a single metal may be laminated. In a case where a plurality of layers are laminated, it is preferable that the layers are laminated such that a layer having a surface energy closer to the surface energy of the silver-containing metal layer is laminated on the side closer to the silver-containing metal layer.

On the other hand, there is a concern of lowering of transparency due to the metal constituting such an anchor metal layer, but it is found that transparency is improved by effectively oxidizing the anchor metal to form a metal oxide.

Although it is described in Patent Document 3 that as the protective layer for protecting the metal thin film from corrosion, a metal oxide may be provided for the upper and lower layers of the metal thin film, in a case where the underlayer when the silver-containing metal layer is formed is an oxide layer, as already described above, a uniform ultrathin metal film cannot be formed. On the other hand, in a method for producing the laminated film according to the embodiment of the present disclosure, the anchor metal is not oxidized and the silver-containing metal layer is formed on the anchor metal layer. Thus, it is possible to sufficiently secure flatness. Since the anchor metal layer is oxidized after sufficient flatness and adhesiveness are secured, an ultrathin metal film achieving both high flatness and high transparency can be formed.

There is a case where an oxidized anchor metal (anchor metal oxide) and an unoxidized anchor metal are mixed in the anchor region. However, it is desirable that the content ratio of the anchor metal oxide is larger than the content ratio of the unoxidized anchor metal, and it is particularly preferable that the anchor metal included in the anchor region is fully oxidized. The magnitude relationship between the content ratio of the oxide of the anchor metal and the content ratio of the unoxidized anchor metal in the anchor region can be confirmed based on the signal intensity ratio in measurement by X-ray photoelectron spectroscopy (XPS).

The cap region is considered to have an effect of preventing silver from aggregating and growing into a granular form at the time of application of anchor metal oxidation treatment. In the production process, in a stage in which the anchor metal layer and the silver-containing metal layer are sequentially formed, the anchor metal starts to move to the cap region and in this state, oxidation of the anchor metal moved to the surface occurs by exposure to the atmosphere.

It is considered that the anchor metal becomes stable by becoming an oxide, and cap performance such as silver migration suppression, aggregation suppression, long-term stability, and moisture resistance is improved. The most part of the anchor metal of the cap region is oxidized through the oxidation step of the anchor metal described later. In this case, it is preferable that 80% or more of the anchor metal included in the cap region is oxidized through anchor metal oxidation treatment described later and it is more preferable that all of the anchor metal in the cap region is oxidized to form an anchor metal oxide. For example, in a case where the anchor metal is Ge, it is preferable to satisfy Ge/O≤1/1.8 and it is particularly preferable to satisfy Ge/O=1/2.

The anchor metal diffusion control layer 16 is a layer provided to control the diffusion of the anchor metal. As already described above, an ultrathin film of 20 nm or less can be formed by incorporating the anchor metal layer in the formation of the ultrathin metal film. Further, by controlling the diffusion of the anchor metal constituting the anchor metal layer, an ultrathin film silver-containing metal layer can be maintained in a more stable state. By forming the silver-containing metal layer 14 in a state in which the anchor metal layer is not oxidized, the flatness of the silver-containing metal layer is secured. Thereafter, by performing the anchor metal oxidation treatment, the anchor metal is diffused and moved to the cap region on the silver-containing metal layer through the silver-containing metal layer 14. In this time, the present inventors have found that in a case where the whole anchor metal is moved to the cap region, the stability of the silver-containing metal layer 14 as a film is lowered, the flatness is not retained, and partial aggregation occurs in some cases.

In the laminated film according to the embodiment of the present disclosure, in order to control the diffusion of the anchor metal, as the underlayer of the anchor metal layer, the anchor metal diffusion control layer is provided. For the anchor metal diffusion control layer, the ability to attract the anchor metal is important. The present inventors have focused on and investigated the Hamaker constant which is an index of van der Waals force known as a force to attract substances to each other, and it has been found that by providing the anchor metal diffusion control layer 16 having a Hamaker constant of $7.3 \times 10^{-20}$ J or more, it is possible to form an ultrathin silver-containing thin film layer of a thickness of 20 run or less in which the diffusion of the anchor metal is suppressed and high uniformity is attained.

The Hamaker constant can be obtained as follows based on the van Oss theory. The surface energy γ is divided into three components of a Lifshitz vdW (van der Waals) term ($\gamma^{LW}$), a donor term ($\gamma^-$), and an acceptor term ($\gamma^+$) and calculated as $\gamma = \gamma^{LW} + 2(\gamma^+\gamma^-)^{1/2}$. The contact angles of three liquids of water, diiodomethane, and ethylene glycol are measured and the Lifshitz vdW term ($\gamma^{LW}$) in the surface energy of the thin film is calculated. Then, the Hamaker constant $A_{11}$ is calculated from $A_{11} = 24\pi D_0^2 \gamma^{LW}$. "Intermolecular and Surface Forces (3rd edition)", J. N. Israelachvili, Asakura Shoten, (translated by Hiroyuki Oshima) is referred to and $D_0 = 0.165$ nm is adopted (from the rule of thumb).

As already described above, a certain degree of anchor metal diffusion is preferable for forming the cap region and the Hamaker constant is preferably $30.0 \times 10^{-20}$ J or less.

The material for the anchor metal diffusion control layer 16 is not particularly limited as long as the Hamaker constant is $7.3 \times 10^{-20}$ J or more. However, the material is preferably transparent to visible light and preferably contains a metal oxide, a metal nitride, a metal oxynitride or a metal carbide to obtain sufficient transparency. Specific examples of constitutional materials include an oxide, nitride, oxynitride, or carbide of Hf, Zr, Ta, Mg, Al, La, Y, or Ti, and a mixture thereof. Generally, since a nitride of a metal has a larger Hamaker constant than an oxide of the same metal, the effect of suppressing the diffusion of the anchor metal is high. On the other hand, an oxide of a metal is more transparent than a nitride thereof. More specifically, examples of specific materials constituting the anchor metal diffusion control layer 16 include MgO ($A_{11} = 7.3 \times 10^{-20}$ J), $Ta_2O_5$ ($A_{11} = 9.5 \times 10^{-20}$ J), $Al_2O_3$ ($A_{11} = 9.6 \times 10^{-20}$ J), $TiO_2$ ($A_{11} = 1 \times 10^{-20}$ J), $HfO_2$ ($A_{11} = 11.2 \times 10^{-20}$ J), and $ZrO_2$ ($A_{11} = 11.8 \times 10^{-20}$ J). The numbers in the parenthesis indicate the Hamaker constant $A_{11}$. Among these, it is preferable to contain a Hf oxide ($HfO_2$). It is more preferable that the occupancy ratio of Hf oxide in the anchor metal diffusion control layer is 50% by mole or more and it is particularly preferable that the anchor metal diffusion control layer is constituted of only $HfO_2$ (the occupancy ratio is 100% by mole). The present inventors have confirmed that in a case of using $HfO_2$, the uniformity, that is, flatness of the silver-containing metal layer is particularly high (refer to Examples below).

The film thickness of the anchor metal diffusion control layer 16 is preferably 5 nm or more and 100 nm or less to improve the adhesiveness with the silver-containing metal layer 14.

The anchor metal diffusion control layer 16 is formed of a material different from the material constituting the inorganic layer 24 of the organic/inorganic multilayer 20. By providing the anchor metal diffusion control layer 16 instead of providing the anchor metal layer directly on the inorganic layer 24, the present inventors have found that the effect of improving the adhesiveness can be obtained (refer to Examples described below). It is considered that by fixing a defect on the surface of the inorganic layer 24 by the anchor metal diffusion control layer, the adhesiveness is improved and the peeling can be suppressed.

By providing the anchor region and the cap region as described above and providing the anchor metal diffusion control layer, an ultrathin silver film structure achieving both high flatness and high transparency can be realized. The laminated film according to the embodiment of the present disclosure may include other functional layers such as a protective layer having a function of protection for suppressing oxidation of the silver-containing metal layer, in addition to the above-described respective layers described in the embodiment. In addition, in the film formation of each layer constituting the laminated film according to the embodiment of the present disclosure, regarding layers other than the silver-containing metal layer, in a case where an ultrathin layer in order of nm is formed, it is difficult to form a uniform film, and in reality, an uneven film is formed or parts (sea) not partially formed into a sea-island state are formed. However, the present invention includes such forms.

Figure 2:
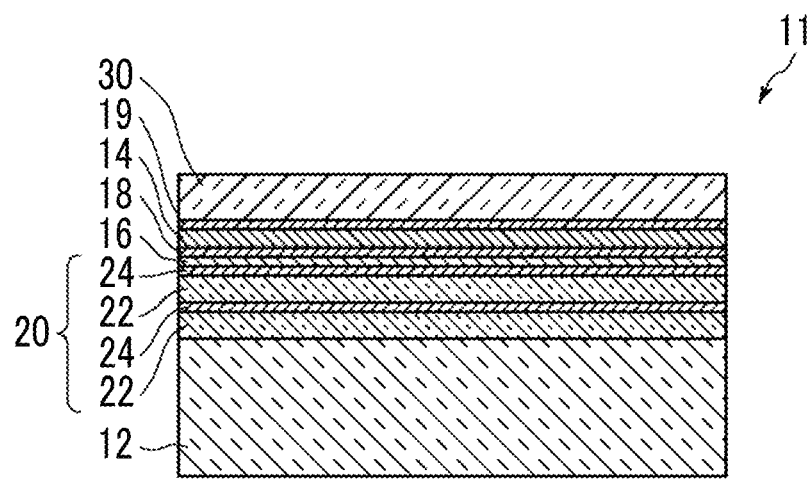
FIG. 2 is a schematic cross-sectional view showing a schematic configuration of a laminated film according to a second embodiment of the present invention.

FIG. 2 shows a schematic cross-sectional view of a schematic configuration of a laminated film 11 according to a second embodiment. As shown in FIG. 2, in the configuration of the laminated film according to the first embodiment, a dielectric layer 30 may be further provided on the cap region 19. As the dielectric layer 30, a layer of low refractive index having a refractive index of 1.35 or more and 1.51 or less is preferably provided. The material for constituting the dielectric layer 30 is not particularly limited. Examples thereof include silicon oxide ($SiO_2$), silicon oxynitride (SiON), magnesium fluoride ($MgF_2$), and sodium aluminum fluoride ($Na_3AlF_6$). Particularly preferable is $SiO_2$ or $MgF_2$. The refractive index can be changed to some extent by controlling any of these compounds to have the constitutional element ratio which is shifted from the compositional ratio of the stoichiometric ratio or by forming a film by controlling the film formation density.

The film thickness of the dielectric layer 30 is preferably about λ/4n in a case in which a target wavelength is λ and the refractive index of the dielectric layer is n. Specifically, the thickness of the dielectric layer is about 70 nm to 100 nm.

By providing the dielectric layer 30 having a refractive index and a film thickness in the above ranges, the antireflection properties can be improved.

Figure 3:
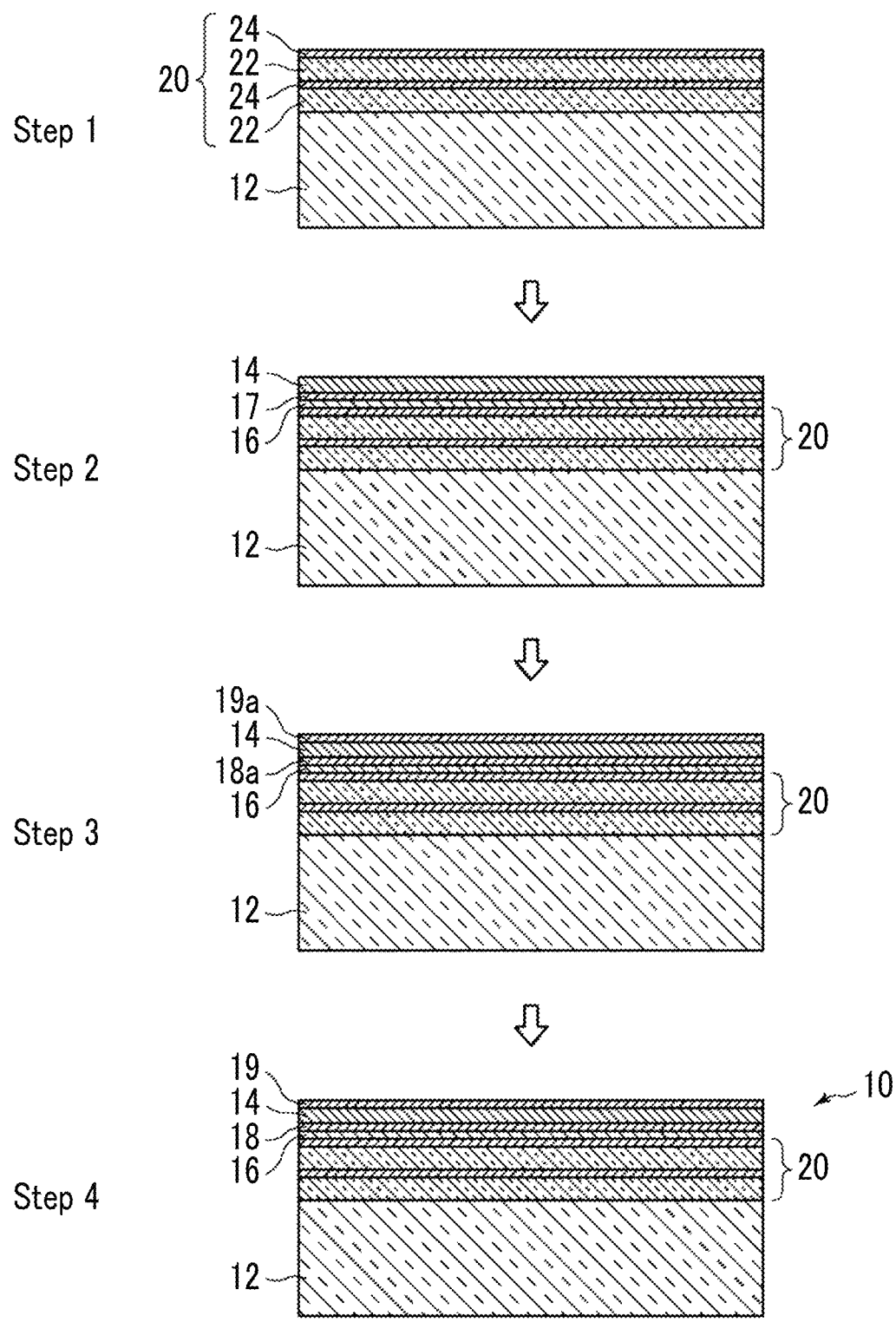
FIG. 3 is a diagram showing a production step of the laminated film according to the first embodiment.

Next, the method for producing the laminated film 1 according to the embodiment shown in FIG. 1 will be described. FIG. 3 is a diagram showing a production step.

First, a film including the organic/inorganic multilayer 20 in which the organic layer 22 and the inorganic layer 24 are alternately laminated on the resin substrate 12 is prepared (Step 1). The outermost surface of the organic/inorganic multilayer 20 is constituted of the inorganic layer 24. Here, the outermost surface means the surface of the organic/inorganic multilayer 20 opposite to the resin substrate 12.

Thereafter, an anchor metal diffusion control layer 16 is formed on the surface of the inorganic layer 24, an anchor metal layer 17 formed of an anchor metal is formed, and further, a silver-containing metal layer 14 is formed (Step 2). The film formation of the anchor metal diffusion control layer 16, the anchor metal layer 17, and the silver-containing metal layer 14 is performed in an atmosphere in which oxygen is not present. The formed film thickness of the anchor metal layer 17 is preferably about 0.2 nm to 2.0 nm.

Since a part of the anchor metal constituting the anchor metal layer 17 is moved to the surface of the silver-containing metal layer 14 in the production process as described above, the anchor metal layer 17 is altered into an anchor region and the thickness is greatly changed. The movement (diffusion) of the anchor metal starts to occur immediately after the silver-containing metal layer 14 is formed.

In the anchor metal that has started to move, the anchor metal moved to the surface of the silver-containing metal layer 14 begins to be oxidized in a case where the layer is exposed to the atmosphere, but in order to sufficiently oxidize the anchor metal, a laminate in which the organic/inorganic multilayer 20, the anchor metal diffusion control layer 16, the anchor metal layer 17, and the silver-containing metal layer 14 are laminated on the resin substrate 12 in this order is exposed to a water vapor atmosphere to perform oxidation treatment of the anchor metal using oxygen molecules and water as reactive species (Step 3 and Step 4).

At the start of the oxidation treatment process, a part of the anchor metal in the anchor metal layer 17 has already passed through the silver-containing metal layer 14 and while a precursor region 19a of the cap region is being formed on the surface of the silver-containing metal layer 14, the anchor metal layer 17 forms a region 18a in the middle of alteration into the anchor region (Step 3).

After the oxidation treatment, the anchor metal layer 17 is altered into the anchor region 18 through the region 18a. Then, a cap region 19 formed of a metal oxide formed by oxidizing the anchor metal which has passed through the silver-containing metal layer 14 and moved to the surface of the laminate on the surface side of the silver-containing metal layer 14 (Step 4) is formed. Since the laminate comprises the anchor metal diffusion control layer 16, the diffusion of the anchor metal is suppressed and a region of the silver-containing metal layer 14, in which the anchor metal layer 17 is formed, on a side close to the resin substrate 12, that is, the anchor metal can be allowed to remain in the anchor region 18.

Through the above steps, it is possible to prepare the laminated film 1 according to the embodiment shown in FIG. 1.

The oxidation treatment step is an oxidation treatment step performed in a water vapor atmosphere in which the water vapor amount is 50 g/m$^3$ or more and an oxygen molecule concentration is 5 vol % or more using oxygen molecules and water as reactive species. The oxidation treatment step is more preferably performed in a water vapor atmosphere having an oxygen molecular concentration equal to or higher than the oxygen molecular concentration in the atmosphere, that is, an oxygen molecular concentration of 20 vol % or higher. Since water is contained in the reaction atmosphere, the oxygen diffusion rate is improved and low temperature oxidation can be achieved by improving the oxygen diffusion rate at a low temperature. Therefore, the anchor metal can be sufficiently oxidized at a low temperature equal to or lower than the heat resistant temperature of the resin substrate 12.

The treatment temperature is a temperature at which resin substrates of PET, PEN, and the like with low heat resistance, which are suitable as resin substrates, are not damaged, and is 150° C. or lower, preferably 120° C. or lower, and even more preferably 100° C. or lower. The treatment temperature is preferably 30° C. or higher and 100° C. or lower, more preferably 50° C. or higher and 90° C. or lower, and even more preferably 60° C. or higher and 85° C. or lower. The water vapor amount in the water vapor atmosphere is preferably 100 g/m$^3$ or more and more preferably 240 g/m$^3$ or more. The oxidation treatment time is preferably 1 minute or longer and 2 hours or shorter, more preferably 5 minutes or longer and 1 hour or shorter, and even more preferably 10 minutes or longer and 30 minutes or shorter.

In an atmosphere that does not sufficiently contain water vapor at a low temperature of 100° C. or lower, the anchor metal cannot be oxidized sufficiently. In addition, in the oxidation process based on oxygen atoms such as ozone and oxygen plasma, which are generally used for oxidation treatment at low temperature, not only the anchor metal but also the silver-containing metal layer is oxidized, and the properties as a metal layer are deteriorated. In the water vapor atmosphere in this oxidation treatment step, oxygen is basically present in the form of oxygen molecule, and does not contain active oxygen such as ozone, which is normally contained in the atmosphere. That is, the active oxygen concentration in the water vapor atmosphere is 10 ppm or less and preferably 1 ppm or less.

By forming the dielectric layer 30 on the cap region 19 which becomes the outermost surface of the laminated film 10 if required, the laminated film 11 according to the second embodiment shown in FIG. 2 can be prepared.

A laminated film according to one embodiment of the present disclosure can be used as a transparent conductive film or an antireflection film. In addition, application to electromagnetic wave shields, infrared heat shielding films, and the like is also possible.

EXAMPLES

Hereinafter, laminated films of Examples and Comparative Examples of the present invention were prepared to verify the effects of the present invention.

<Preparation Method of Examples and Comparative Examples>

—Preparation of Gas Barrier Layer—

Polyethylene naphthalate (PEN) film (TEONEX Q65FA manufactured by DuPont Teijin Films, thickness: 100 μm, width: 1000 mm) was used as a resin substrate.

A composition for applying an organic layer including a polymerizable compound (trimethylolpropane triacrylate (TMPTA) manufactured by Daicel-Cytec Company LTD.: 100 parts by mass), a photopolymerization initiator (IRGACURE 184 manufactured by BASF), and methyl ethyl ketone (MEK) was prepared. The amount of MEK was prepared so that the dry film thickness was 1 m and the amount of the photopolymerization initiator was in the composition was 3% by mass.

The composition for applying an organic layer obtained above was applied to the PEN film using a die coater and dried at 50° C. for 3 minutes. Thereafter, the film was cured by irradiation with ultraviolet rays (accumulated irradiation amount of about 600 mJ/cm$^2$) to form an organic layer having a thickness of 1 μm. An inorganic layer (silicon nitride layer) was formed on the surface of the organic layer using a chemical vapor deposition (CVD) apparatus. In this case, silane gas (flow rate: 160 sccm: 0° C. in a standard state of 1 atm, the same applies hereinafter), ammonia gas (flow rate: 370 sccm), hydrogen gas (flow rate: 590 sccm), and nitrogen gas (flow rate: 240 sccm) were used as raw material gases. As a power source, a high frequency power source having a frequency of 13.56 MHz was used. The film formation pressure was 40 Pa, and the ultimate film thickness was 50 nm. In this manner, a gas barrier layer formed of an organic/inorganic multilayer including one organic layer and one inorganic layer was formed.

On the gas barrier layer prepared as described above, an anchor metal diffusion control layer, an anchor metal layer, and a silver-containing metal layer were formed. For film formation, a sputtering device (CFS-8EP) manufactured by Shibaura Mechatronics Corporation was used. The conditions for forming each layer were as follows. In the following, the room temperature is 20° C. or higher and 30° C. or lower.

—Film Formation Conditions of Anchor Metal Diffusion Control Layer—

RF (alternating current) input power=400 W

Ar: 40 sccm, $O_2$: 2.5 sccm, Depo pressure (film formation pressure): 0.21 Pa

Film formation temperature: room temperature

The layer was formed to have a film thickness of 20 nm.

After the anchor metal diffusion control layer, was formed, an anchor metal layer formed of Ge was subsequently formed without being exposed to the atmosphere.

—Film Formation Conditions of Anchor Metal Layer—

Direct current (DC) input power=20 W

Ar: 20 sccm, Depo pressure (film formation pressure): 0.45 Pa

Film formation temperature: room temperature

The layer was formed to have a film thickness of 0.68 nm.

Further, after the anchor metal layer was formed, a silver-containing metal layer was subsequently formed without being exposed to the atmosphere. Here, a silver film was formed as the silver-containing metal layer.

—Film Formation Conditions of Silver-Containing Metal Layer (Silver Film)—

DC input power=80 W

Ar: 15 sccm, Depo pressure: 0.27 Pa

Film formation temperature: room temperature

The layer was formed to have a film thickness of 4 nm.

In Examples 1 to 9 and Comparative Examples 1, 2, 4, and 5, the above steps were common. Comparative Example 3 was the same as Example 1 except that the anchor metal diffusion control layer was not provided and the anchor metal layer was formed directly on the gas barrier layer.

Thereafter, the anchor metal was oxidized under the conditions shown in Table 2 below, and the laminated films of Examples 1 to 9 and Comparative Examples 1 to 5 were prepared.

[Preparation of Anchor Oxide Layer]

The obtained film was heated at 100° C. in the atmosphere, and then oxidized using an ESPEC small environmental tester SH642 under the conditions shown in Table 2 below (Examples 1 to 9 and Comparative Example 2 and 3). The water vapor amount in the water vapor atmosphere was calculated as follows.

(1) Water vapor pressure e is obtained from temperature t.

$$e=6.11\times10^{(7.5t/(t+237.3))} \quad \text{Tetens equation}$$

(2) The water vapor amount a (g/m$^3$) is obtained from the obtained saturated water vapor pressure e, the temperature t, and the relative humidity rh.

$$a=217\times e/(t+273.15)\times rh/100$$

In each of Examples 1 to 9 and Comparative Example 3, oxidation treatment was performed in a water vapor atmosphere with a water vapor amount of 100 g/m$^3$ or more. On the other hand, in Comparative Example 1, oxidation treatment was not performed. In Comparative Example 2, oxidation treatment was performed in an atmosphere that contains a water vapor amount to an extent which is not a normal indoor environment, contains water vapor in an amount of 43.4 g/m$^3$, and does not contain a water vapor amount of 50 g/m$^3$ or more as defined in the present invention.

On the other hand, in Comparative Example 1, oxidation treatment was not performed. In addition, in Comparative Example 4, oxidation treatment was performed by exposing the laminate to a UV ozone atmosphere and in Comparative Example 5, oxidation treatment was performed by exposing the laminate to an oxygen plasma atmosphere for 10 minutes. The oxidation treatment was performed using FILGEN UV/O3 cleaner and a plasma cleaner manufactured by Shinko Seiki Co., Ltd., respectively.

For Examples and Comparative Examples obtained as described above, the uniformity of the silver-containing metal layer and the permeability of the laminated film were evaluated.

<Evaluation of Transparency>

The absorbance of light in a visible wavelength range of 400 nm to 800 nm was measured with a spectrophotometer. Specifically, using a spectrophotometer (HITACHI U-4000), measurement was performed at a scanning speed of 600 nm/min in a wavelength range of 400 nm to 800 nm. The absorbance at 550 nm was calculated by measuring the transmission and reflection spectra. In a case where the absorbance is 8% or less, it is possible to determine that the transparency is good. In Comparative Examples 4 and 5, since coloring was apparently observed, the absorbance measurement was not performed for evaluation of transparency.

<Evaluation of Uniformity>

Sheet resistance values were measured using a four-terminal method for the prepared laminated films of Examples 1 to 9 and Comparative Examples 1 to 5. The sheet resistance value (Ω/□) using the four-terminal method was performed using LORESTER GP and ESP probes manufactured by Mitsubishi Chemical Corporation.

The sheet resistance value of the silver-containing metal layer is an indicator showing film uniformity since the sheet resistance value increases due to partial resistance increase in the discontinuous part of the silver-containing metal layer and the part where the film thickness changes. The sheet resistance value decreases with increasing film uniformity particularly, flatness) and increases with decreasing film uniformity. Here, in a case where the measured value is 35Ω/□ or less, it was evaluated that the conductivity is good.

<Evaluation of Adhesiveness>

—Bending Test—

A bending test of a film that was bent from a flat state to a bending radius (10 mm) was conducted. The sheet resistance value after 1000 bending tests was measured in the same manner as above.

It is considered that in a case where the sheet resistance value measured before the bending test after film formation (measured value when evaluating uniformity) is compared with the sheet resistance value after the bending test, the reason why the sheet resistance value is changed twice or more is that peeling occurs in the laminated film. For Comparative Examples 4 and 5, since the sheet resistance before the bending test was already out of the measurement range as shown in Table 2 below, the bending test was not performed.

The production conditions and evaluation results for each of Examples and Comparative Examples are collectively shown in Table 2.

TABLE 2

| | | Layer structure | | | | Oxidation treatment condition | | | | | Sheet resistance value before bending test ($\Omega/\square$) | Sheet resistance value after bending test ($\Omega/\square$) |
|---|---|---|---|---|---|---|---|---|---|---|---|---|
| | Substrate | Barrier | Anchor metal diffusion control layer | Anchor metal layer | Metal layer | Atmosphere | Temperature (°C) | Humidity (%) | Time (min) | Water vapor amount (g/m³) | Absorbance | |
| Example 1 | PEN | Provided | HfO$_2$ | Ge | Ag | Water vapor | 85 | 30 | 10 | 105 | 5.85 | 34 | 38 |
| Example 2 | PEN | Provided | HfO$_2$ | Ge | Ag | Water vapor | 85 | 50 | 10 | 179 | 5 | 32 | 34 |
| Example 3 | PEN | Provided | HfO$_2$ | Ge | Ag | Water vapor | 85 | 70 | 10 | 246 | 4.87 | 32 | 33 |
| Example 4 | PEN | Provided | HfO$_2$ | Ge | Ag | Water vapor | 85 | 85 | 10 | 299 | 4 | 29 | 30 |
| Example 5 | PEN | Provided | HfO$_2$ | Ge | Ag | Water vapor | 85 | 85 | 30 | 299 | 3.84 | 27 | 29 |
| Example 6 | PEN | Provided | HfO$_2$ | Ge | Ag | Water vapor | 85 | 85 | 60 | 299 | 3.9 | 27 | 29 |
| Example 7 | PEN | Provided | HfO$_2$ | Ge | Ag | Water vapor | 85 | 85 | 120 | 299 | 3.82 | 27 | 29 |
| Example 9 | PEN | Provided | HfO$_2$ | Ge | Ag | Water vapor | 60 | 85 | 10 | 110 | 5.23 | 33 | 35 |
| Comparative Example 1 | PEN | Provided | HfO$_2$ | Ge | Ag | — | — | — | — | — | 9 | 40 | 42 |
| Comparative Example 2 | PEN | Provided | HfO$_2$ | Ge | Ag | Water vapor | 40 | 85 | 10 | 43.4 | 8.5 | 37 | 40 |
| Comparative Example 3 | PEN | Provided | None | Ge | Ag | Water vapor | 85 | 85 | 10 | 299 | 5 | 30 | 500 |
| Comparative Example 4 | PEN | Provided | HfO$_2$ | Ge | Ag | UV ozone | Room temperature environment | — | 10 | — | Coloring | ∞ | — |
| Comparative Example 5 | PEN | Provided | HfO$_2$ | Ge | Ag | Oxygen plasma | Room temperature environment | — | 10 | — | Coloring | ∞ | — |

As shown in Table 2, in Comparative Example 1 in which oxidation treatment was not performed, the absorbance was 9% and was slightly high. It is considered that this is because the effect of suppressing absorption by Ge is not sufficient due to the insufficient oxidation of Ge which is an anchor metal. That is, it is considered that the anchor metal cannot be oxidized sufficiently only by heat treatment at 100° C. in the atmosphere. In addition, similarly, in Comparative Example 2, the anchor metal was not sufficiently oxidized, and the absorbance was 8.5% and was slightly high. It is considered that the water vapor amount during the oxidation treatment is insufficient and the oxidation does not progress sufficiently.

The laminated film of Comparative Example 3 was peeled off by the bending test. It is considered that sufficient adhesiveness is not obtained by the method of providing an anchor metal layer directly on the gas barrier layer. On the other hand, the laminated films of Comparative Examples 4 and 5 were so large that the sheet resistance could not be measured. It is considered that this is because the silver in the silver-containing metal layer is oxidized and lost its conductivity.

In Examples 1 to 9, the results were high in transparency and sufficiently high in conductivity. Also, the sheet resistance value before and after bending test was almost not changed and the adhesiveness was good. In a case of comparing Examples 1 to 4 in which only the water vapor amount in the atmosphere during the oxidation treatment was changed, there was a tendency that the sheet resistance and absorbance decreased as the water vapor amount increased. From the results of Examples 5 to 7 in which only the oxidation treatment time was changed, both the sheet resistance value and the absorbance hardly changed at the treatment time of 30 minutes or longer and 120 minutes or shorter.

Hereinafter, the results of verifying that the anchor metal layer formed in the process of the production method according to one embodiment of the present disclosure constitutes an anchor region and a cap region sandwiching the silver-containing metal layer after oxidation treatment will be described.

<Production Method of Sample 1>

An anchor metal layer formed of Ge was formed on a glass substrate (SiO$_2$ substrate). The film was formed under the following conditions using a sputtering apparatus (CFS-8EP) manufactured by Shibaura Mechatronics Co., Ltd.

—Anchor Metal Layer Formation Conditions—

Direct current (DC) input power=20 W

Ar: 20 sccm, Depo pressure (film formation pressure): 0.45 Pa

Film formation temperature: room temperature

A silver-containing metal layer was formed without exposure to the atmosphere subsequently after the anchor metal layer was formed. Here, a silver film was formed as the silver-containing metal layer. The film formation conditions are as follows.

—Silver Film Formation Conditions—
DC input power=80 W
Ar: 15 sccm, Depo pressure: 0.27 Pa
Film formation temperature: room temperature In the above description, the thickness of the anchor metal layer was 0.68 nm and the silver film having a thickness of 4 nm (film thickness herein is a design film thickness) was formed.

Thereafter, annealing treatment was performed at 300° C. in the atmosphere.

The following measurement was performed on Sample 1 obtained as described above, and the laminated structure was examined.

<Ratio Between Metal Region and Metal Oxide Region in Anchor Region>

The evaluation was performed by X-ray photoelectron spectroscopy (XPS). As the measurement device, Quantera SXM manufactured by ULVAC-PHI, Inc. was used.

Figure 4:
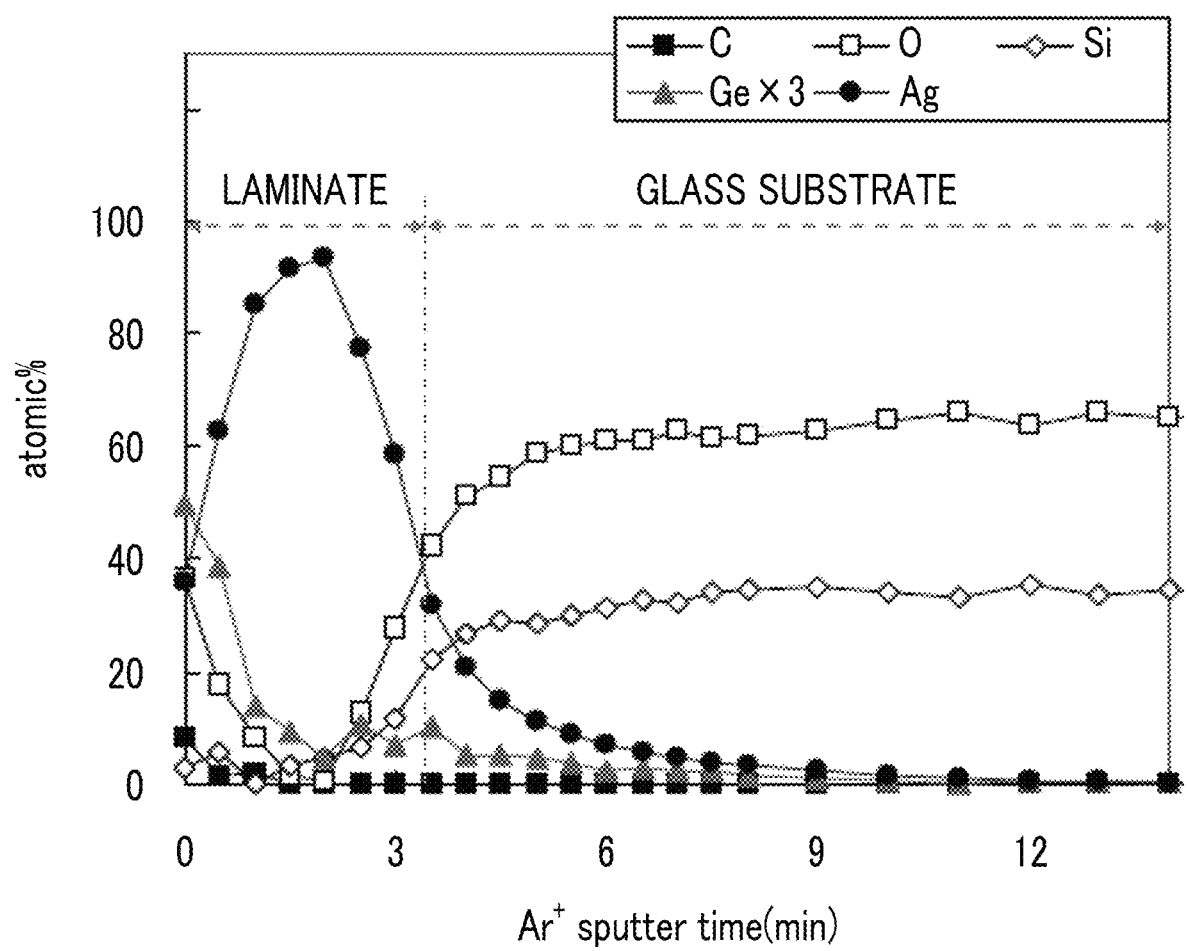
FIG. 4 is a diagram showing an element distribution in a depth direction before annealing treatment of Sample 1.
Figure 5:
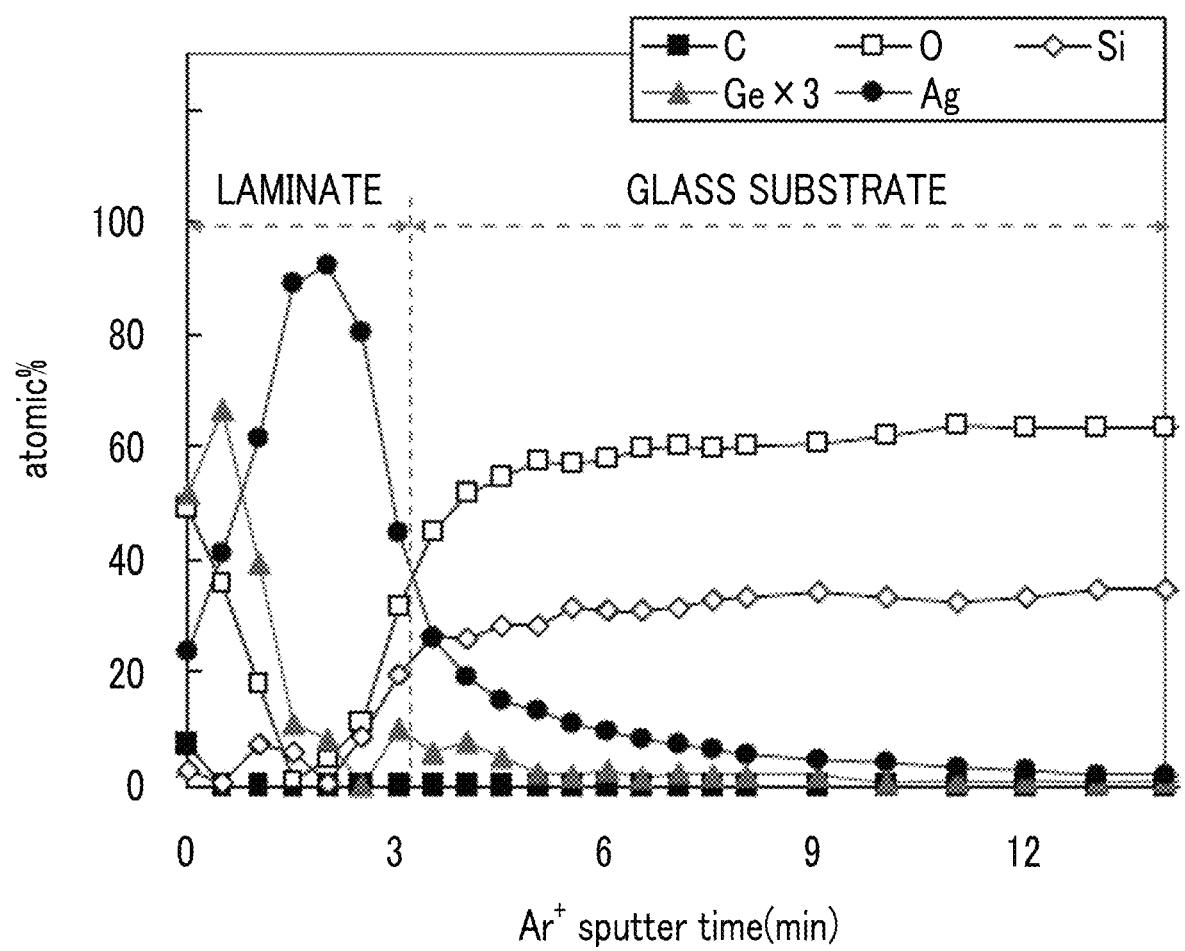
FIG. 5 is a diagram showing an element distribution in the depth direction after annealing treatment of Sample 1.
Figure 6:
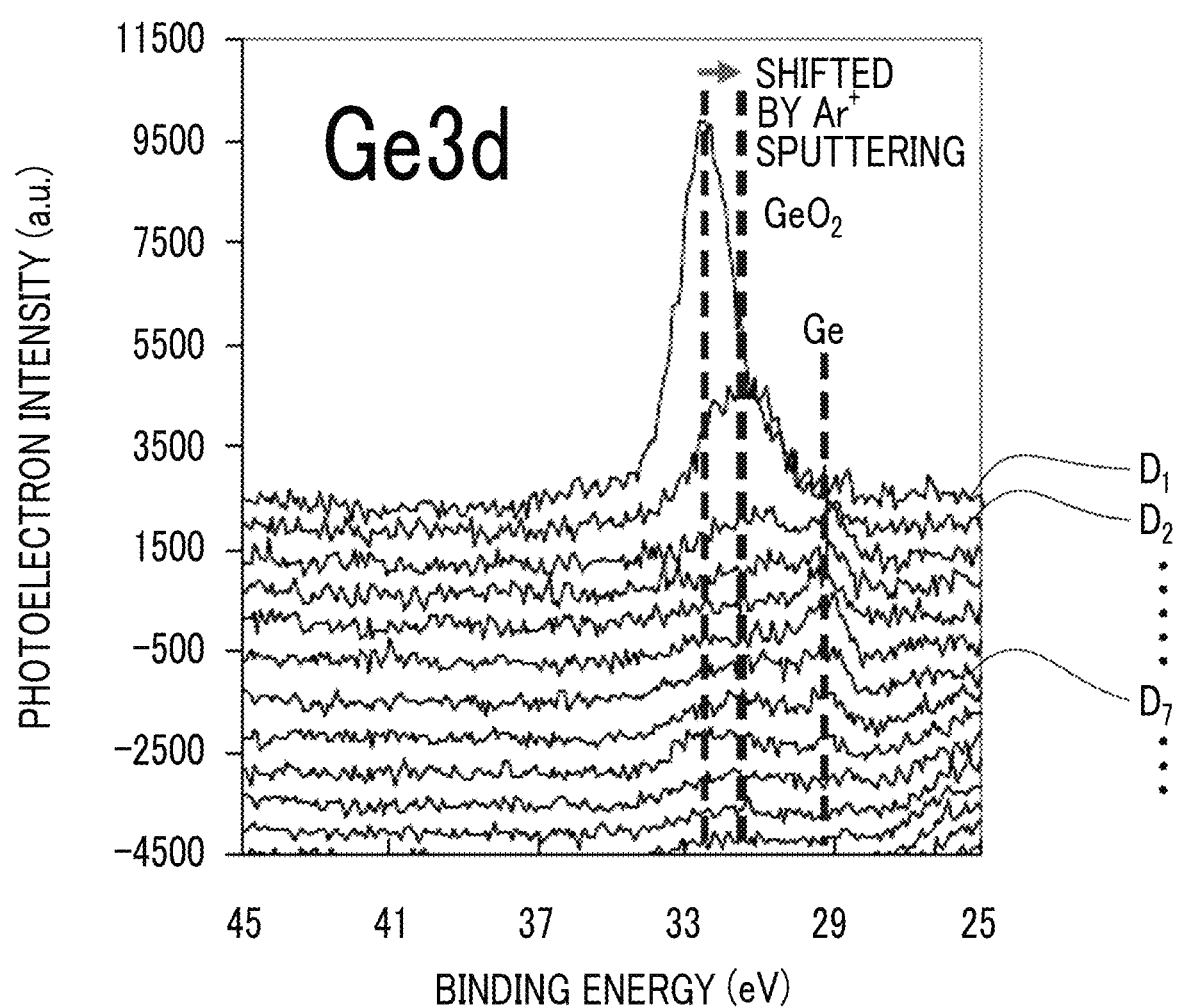
FIG. 6 is a diagram showing a Ge3d spectrum distribution in the depth direction before annealing treatment of Sample 1.
Figure 7:
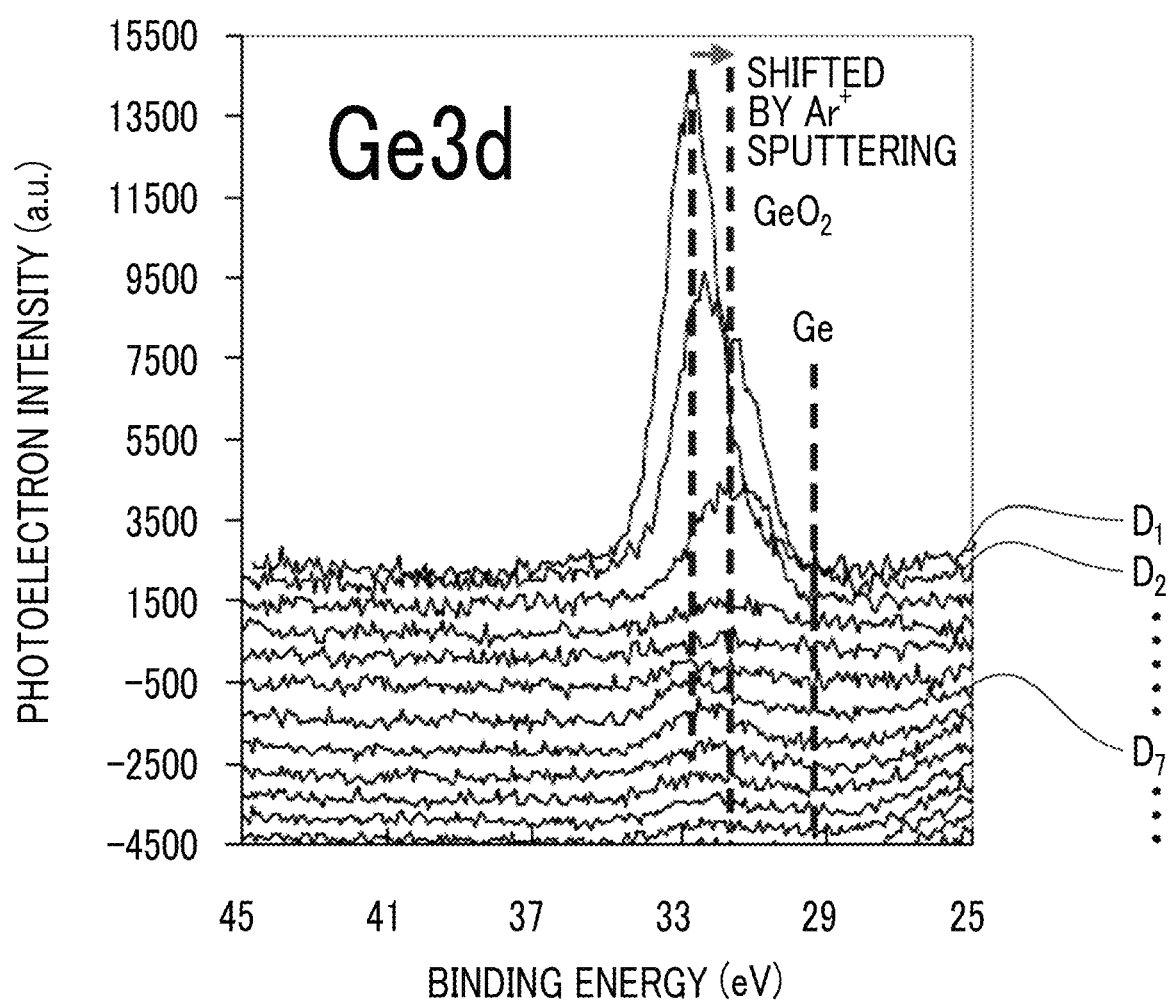
FIG. 7 is a diagram showing a Ge3d spectrum distribution in the depth direction after annealing treatment of Sample 1.

FIGS. 4 and 5 are graphs showing element distributions of Sample 1 in the element distribution depth direction in the depth direction from the surface of the laminate to the direction of the glass substrate before oxidation treatment and after oxidation treatment, and the element distributions are obtained by XPS. In FIGS. 4 and 5, the horizontal axis 0 is the position of the surface of the laminate, and in order to make the distribution of Ge easier to see, Ge is shown at a magnification of 3 times. Therefore, the actual content of Ge is ⅓ of the value on the vertical axis of the graph. FIGS. 6 and 7 show Ge3d spectra (Dn:n=1, 2, 3 . . . ) of Sample 1 obtained by XPS and obtained at each position in the depth direction by drilling by $Ar^+$ sputtering in the depth direction from the surface of the laminate to the substrate before oxidation treatment and after oxidation treatment at the same time. In the drawings, data $D_1$ is the data on the laminate surface position, and as n becomes larger, the data indicates the position closer to the substrate drilled by $Ar^+$ sputtering in a direction perpendicular to the surface. In FIGS. 6 and 7, the peak of $GeO_2$ on the surface is slightly shifted to the low bond energy side due to the effect of $Ar^+$ sputtering. The data acquisition interval in the horizontal axis (sputtering time) in FIGS. 4 and 5 the data acquisition interval from the surface to the substrate in FIGS. 6 and 7 correspond to each other.

By comparing FIG. 6 with FIG. 7, it is found that the peak of $GeO_2$ on the surface becomes large after oxidation treatment, while the peak of Ge present before oxidation treatment is not present after oxidation treatment. In addition, in the inside in the depth direction, before oxidation treatment, the peak intensity of Ge is higher than the peak intensity of $GeO_2$, but after oxidation treatment, inversely, the peak intensity of $GeO_2$ is higher than the peak intensity of Ge. At least from FIG. 7, it is possible to determine that the content of $GeO_2$ is larger than the content of Ge in the anchor region of Sample 1 (after oxidation treatment). Specifically, it is considered that the seventh and eighth data from the surface in FIG. 7 corresponds to the anchor region.

<Evaluation of Presence of Oxide Layer in Cap Region>

The presence of the oxide of the anchor metal in the cap region measured by XPS and a transmission electron microscope (TEM) was evaluated by energy dispersive X-ray spectroscopy (EDX) (FIGS. 6 and 7).

Figure 8:
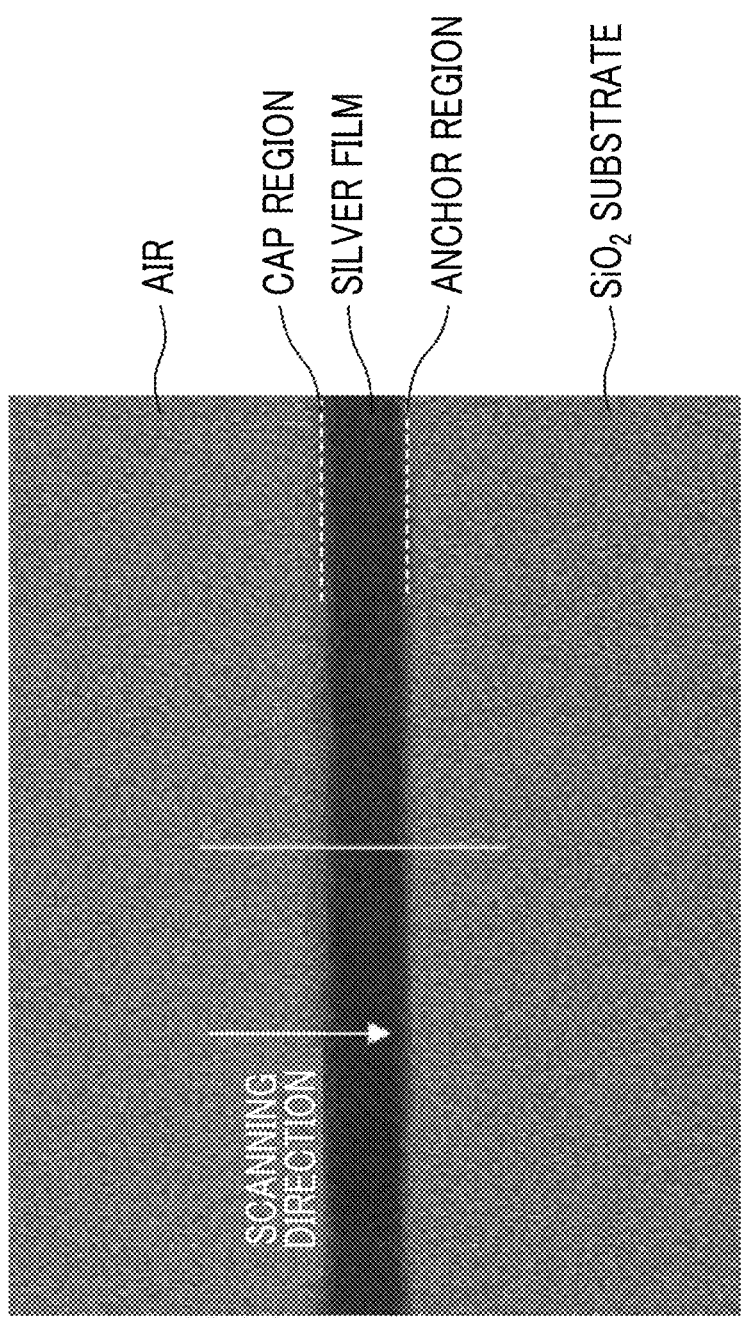
FIG. 8 is a scanning transmission electron microscope image of Sample 1.
Figure 9:
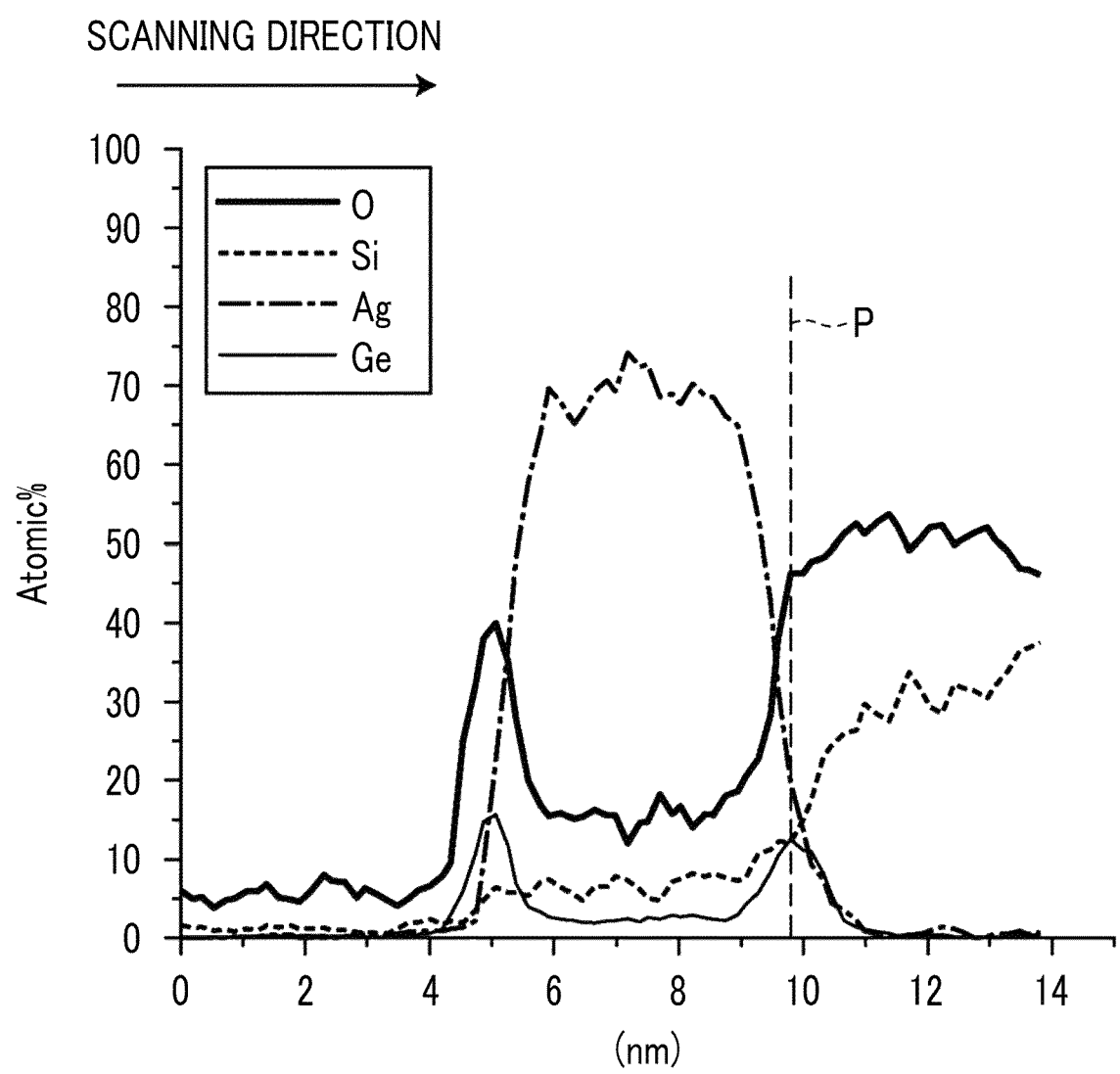
FIG. 9 is a diagram showing the element distribution in the depth direction of Sample 1 by energy dispersive X-ray spectroscopic analysis.

FIG. 8 is a bright-field-scanning transmission electron microscope image (Bright-field-STEM image) of Sample 1, and an EDX analysis portion is the region shown by the white line near the center in FIG. 8. FIG. 9 is a graph showing the distribution of the element to be analyzed in the depth direction according to the EDX analysis result. As a transmission electron microscope, HD-2700 manufactured by Hitachi High-Technologies Corporation was used.

As described above, the presence of $GeO_2$ in the anchor region in Sample 1 was confirmed from FIG. 7. On the other hand, the compositional ratio at each position in the depth direction is clear from the distribution of each element in the depth direction shown in FIG. 9, and from the compositional ratio, it is possible to calculate the existence probability of $GeO_2$ and Ge.

In FIG. 9, the anchor region is near at the position of 9.8 nm (indicated by P in FIG. 9) where the horizontal axis Ge is a peak. Since the anchor region is a region adjacent to the substrate, Si is bled out. At this peak position, the compositional ratio of Ge, Si, and O is Ge (12%), Si (12%), and O (48%) and thus it is found that oxygen is present in the forms of $SiO_2$ and $GeO_2$.

As described above, it was confirmed that by laminating the anchor metal layer and the silver-containing metal layer on the substrate and performing annealing treatment in the atmosphere, a part of Ge constituting the anchor metal layer passed through the silver-containing metal layer, was moved to the surface side of the silver-containing metal layer and oxidized to form a cap region, while at least a part of the anchor region was oxidized.

Here, it is shown that the anchor metal layer became an anchor region and a cap region by annealing at 300° C. in the atmosphere, but it is considered that by performing oxidation treatment in the water vapor atmosphere even at a low temperature as in Examples 1 to 9 described above, the anchor metal layer was oxidized in the same manner to form an anchor region and a cap region. It is clear that the anchor metal is oxidized since the transparency has improved after oxidation treatment. Since the anchor metal layer is an underlayer of the silver-containing metal layer and is not exposed, the anchor metal layer is not easily oxidized. However, it can be estimated that the reason why the anchor metal is sufficiently oxidized as the transparency is improved is that at least a part of the anchor metal, probably most of the anchor metal as in Sample 1 above, passes through the silver-containing metal layer, diffuses in the cap region, and is exposed in the presence of oxygen.

Next, the result of verifying the effects of having an anchor metal diffusion control layer will be described.

A sample in which an anchor metal diffusion control layer, an anchor region, a silver-containing metal layer, and a cap region were provided on a glass substrate was prepared and the transparency thereof and the flatness of the silver-containing metal layer were evaluated. Here, a glass substrate was used instead of a resin substrate and a gas barrier layer was not provided. In addition, for oxidation treatment, annealing treatment was performed in the atmosphere. However, the function of the anchor metal diffusion control layer was the same as in a case of using the configuration according to the present invention using a resin substrate and provided with a gas barrier layer and the production method according to the embodiment of the present invention of performing oxidation treatment in a water vapor atmosphere.

<Preparation Method of Sample>

First, an anchor metal diffusion control layer formed of a material shown in Table 3 was formed on a glass substrate. A film was formed under the following conditions using a sputtering apparatus (CFS-8EP) manufactured by Shibaura Mechatronics Corporation. The following anchor metal layer and silver-containing metal layer were also formed using the same sputtering apparatus.

—Film Formation Conditions of Anchor Metal Diffusion Control Layer—

RF (alternating current) input power=400 W

Ar: 40 sccm, $O_2$: 2.5 sccm, Depo pressure (film formation pressure): 0.21 Pa

Film formation temperature: room temperature

After the anchor metal diffusion control layer was formed, an anchor metal layer formed of Ge was sequentially formed without being exposed to the atmosphere.

—Film Formation Conditions of Anchor Metal Layer—

Direct current (DC) input power=20 W

Ar: 20 sccm, Depo pressure (film formation pressure): 0.45 Pa

Film formation temperature: room temperature

Further, after the anchor metal layer was formed, a silver-containing metal layer was sequentially formed without being exposed to the atmosphere. Here, as the silver-containing metal layer, a silver film was formed.

—Film Formation Conditions of Silver-Containing Metal Layer (Silver Film)—

Direct current (DC) input power=80 W

Ar: 15 sccm, Depo pressure: 0.27 Pa

Film formation temperature: room temperature

In the film formation of each layer, the film thickness of the anchor metal diffusion control layer was set to 20 nm, the film thickness of the anchor metal layer was set to 0.68 nm, and the film thickness of the silver film was 2 nm.

Thereafter, annealing treatment was performed under the conditions of 300° C. and 5 minutes in the atmosphere.

The uniformity and permeability of the films of Samples and Comparative Samples obtained as described above were evaluated.

<Evaluation of Uniformity and Penneability>

—Evaluation of Absorbance of Visible Light—

Figure 10:
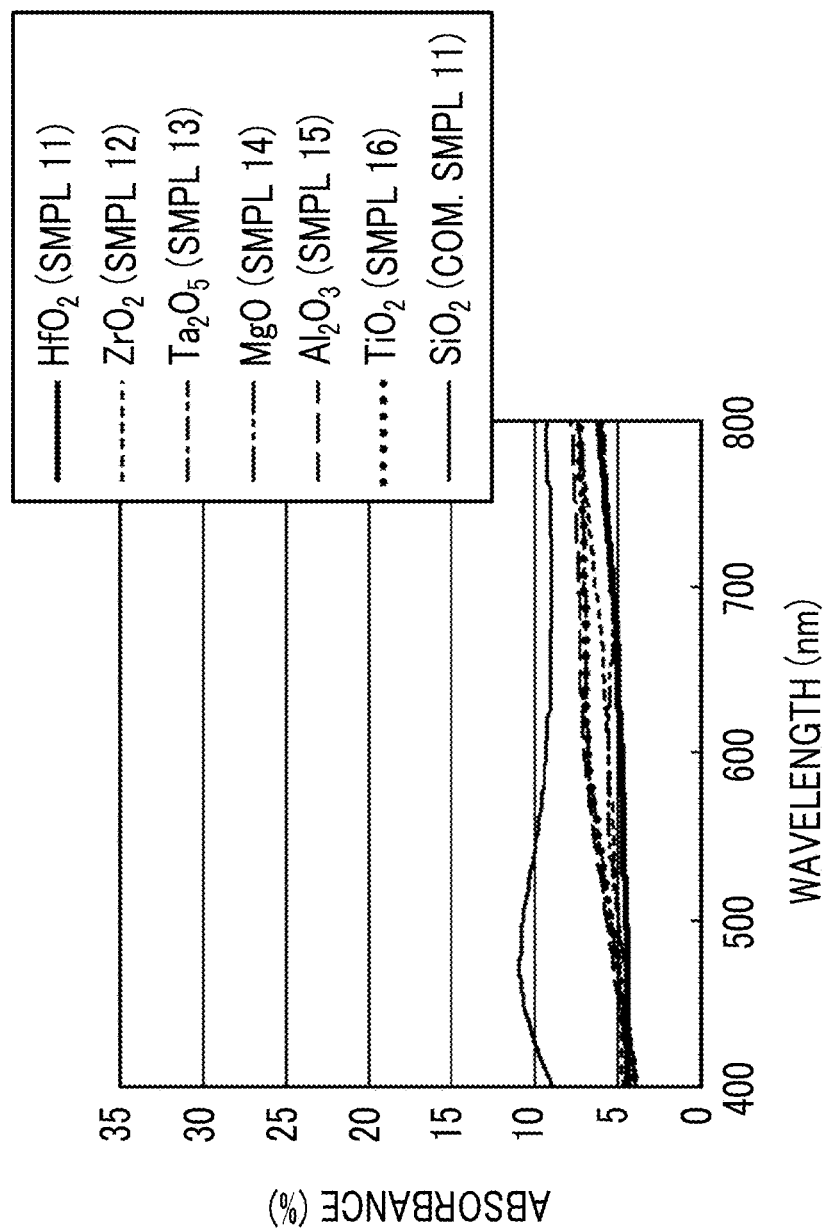
FIG. 10 is a diagram showing a wavelength dependency of absorbance for Samples 11 to 16 and Comparative Sample 11.

The absorbance of light at a wavelength of 400 nm to 800 nm, which is the visible region, was measured by a spectrophotometer. Specifically, using a spectrophotometer (HITACHI U-4000), the absorbance was measured at a scan speed of 600 nm/min in the wavelength range of 400 nm to 800 nm. In a case where plasmon absorption in the visible region occurs, the absorbance increases. In a case where the absorbance is approximately 10% or less, there is no problem in practical use. FIG. 10 shows the measurement results of each example and is a graph showing the wavelength dependency of absorbance. In a wavelength range of 400 nm to 800 nm, those exhibiting an absorbance of more than 10% were evaluated such that plasmon absorption "occurred", and those having an absorbance of 10% or less were evaluated such that plasmon absorption did "not occurred". The results are shown in Table 3.

In addition, in a case where silver is granulated, the plasmon absorption in the visible region occurs. Thus, an increase in the absorbance of visible light means that the granulated portion is increased. That is, the lower the absorbance, the less silver granulation and the higher the flatness of the film. In addition, an increase in the absorbance of visible light leads to a decrease in the transmittance of visible light. Thus, in the evaluation of the absorbance, a case where plasmon absorption does "not occurred" means that the transparency is good.

—Measurement of Electrical Resistivity—

The electrical resistivity (Ωcm) of each of Samples and Comparative Samples was measured by a four-terminal method using LORESTA GP and ESP probes manufactured by Mitsubishi Chemical Corporation. The measurement results are shown in Table 2.

Since the electrical resistivity of the silver-containing metal layer is increased due to a partial increase in resistance in a discontinuous part in the silver-containing metal layer or in a part where the film thickness changes, the electrical resistivity is an indicator showing the uniformity of the film. The electrical resistivity becomes smaller as the film uniformity (in particular, the flatness) becomes higher, and becomes larger as the uniformity becomes lower.

<Measurement of Hamaker Constant>

The Hamaker constant of the anchor metal diffusion control layer was obtained based on the van Oss theory as already described above.

The material constituting the anchor metal diffusion control layer used in each example was used to form a film with a thickness of 20 nm on a separate glass substrate. Regarding the films formed using each material, the contact angles of three liquids of water, diiodomethane, and ethylene glycol were respectively measured by a liquid droplet dropping method using Dropmaster manufactured by Kyowa Interface Science Co., Ltd. and the Lifshitz vdW term ($\gamma^{LW}$) in the surface energy of the thin film was obtained. Then, the Hamaker constant $A_{11}$ was calculated based on the relational expression $A_{11}=24\pi D_0^2 \gamma^{LW}$. Here, $D_0=0.165$ nm was adopted.

Table 3 collectively shows the film configurations and measurement (evaluation) results of Samples 11 to 16 and Comparative Sample 11 prepared by the above methods and evaluated.

TABLE 3

| | Film thickness of silver-containing metal layer | Anchor metal layer | Anchor metal diffusion control layer | | | | |
|---|---|---|---|---|---|---|---|
| | | | Constitutional material | Film thickness | Hamaker constant × $10^{-20}$ J | Plasmon absorption | Resistivity (Ω cm) |
| Sample 11 | 2 nm | Ge (0.68 nm) | $HfO_2$ | 20 nm | 11.2 | Not occurred | $1.20 \times 10^{-5}$ |
| Sample 12 | 2 nm | Ge (0.68 nm) | $ZrO_2$ | 20 nm | 11.8 | Not occurred | $1.40 \times 10^{-5}$ |
| Sample 13 | 2 nm | Ge (0.68 nm) | $Ta_2O_5$ | 20 nm | 9.5 | Not occurred | $1.77 \times 10^{-5}$ |
| Sample 14 | 2 nm | Ge (0.68 nm) | MgO | 20 nm | 7.3 | Not occurred | $2.40 \times 10^{-5}$ |
| Sample 15 | 2 nm | Ge (0.68 nm) | $Al_2O_3$ | 20 nm | 9.6 | Not occurred | $1.81 \times 10^{-5}$ |
| Sample 16 | 2 nm | Ge (0.68 nm) | $TiO_2$ | 20 nm | 10 | Not occurred | $1.70 \times 10^{-5}$ |
| Comparative Sample 11 | 2 nm | Ge (0.68 nm) | $SiO_2$ | 20 nm | 5.6 | Occurred | $4.50 \times 10^{-5}$ |

Figure 11:
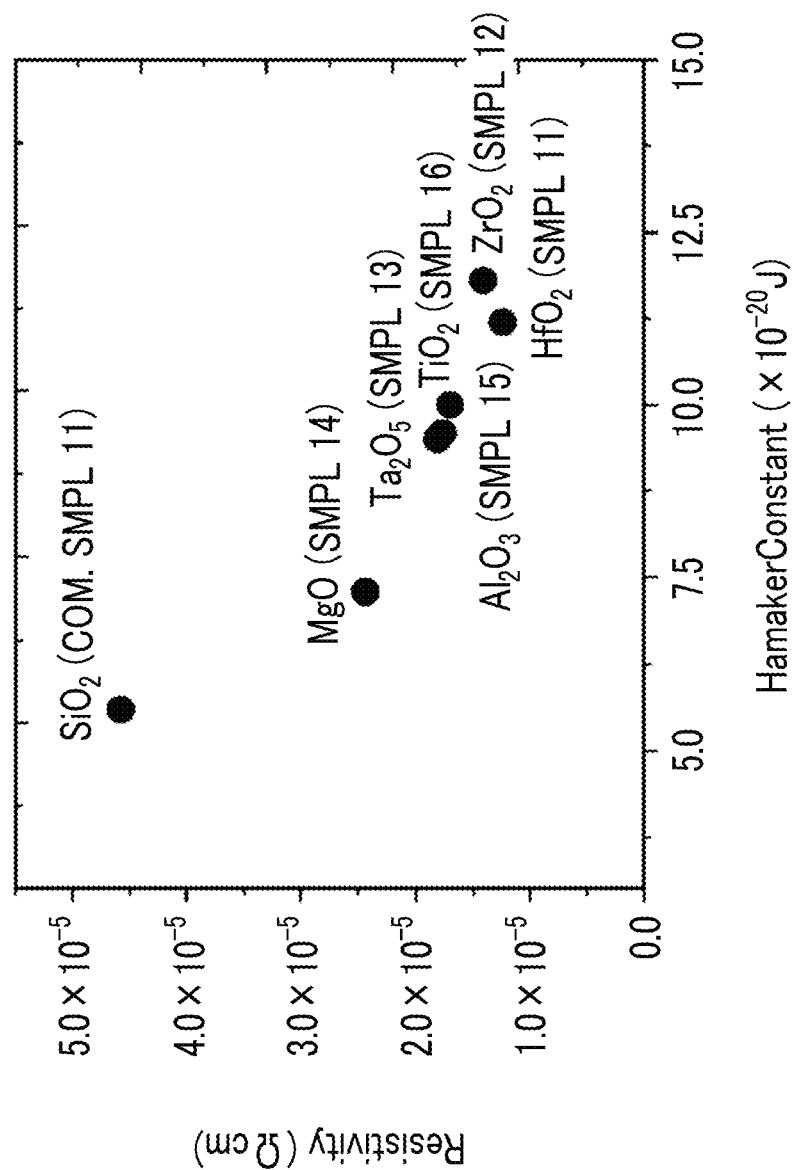
FIG. 11 is a diagram showing a relationship between the Hamaker constant of an anchor metal diffusion control layer and the electrical resistivity of a silver film for Samples 11 to 16 and Comparative Sample 11.

As shown in Table 3, regarding Samples 11 to 16 in which the Hamaker constant of the anchor metal diffusion control layer was $7.3 \times 10^{-20}$ J or more, the result that the plasmon absorption of visible light was suppressed compared to Comparative Sample 11, and the electrical resistivity was low was obtained (refer to FIG. 11). That is, it is considered that Samples 11 to 16 has a silver film having high flatness.

Further, the result of the verification of the effect of the anchor metal diffusion control layer including Hf will be described. The distribution of the amount of Ge in the depth direction was measured for the laminates of Sample 11 using $HfO_2$ for the anchor metal diffusion control layer and Comparative Sample 11 using $SiO_2$ for the anchor metal diffusion control layer obtained as described above. The measurement was performed by XPS using Quantera SXM manufactured by ULVAC-PHI Inc.

Figure 12:
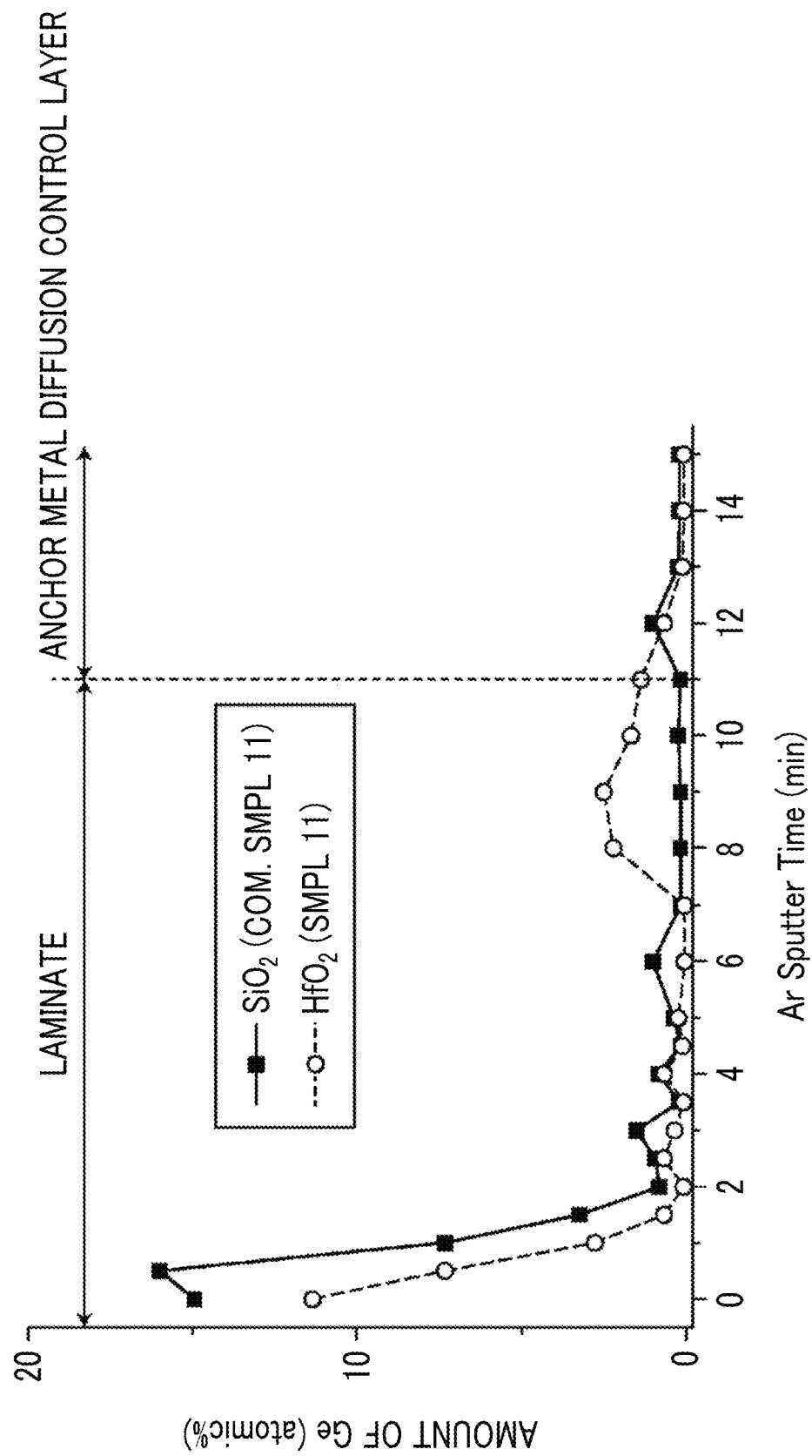
FIG. 12 is a diagram showing the results of analysis of Sample 11 and Comparative Sample 11 by X-ray photoelectron spectroscopy.

Hereinafter, the portion closer to the silver-containing metal layer than to the anchor metal diffusion control layer provided on the glass substrate is referred to as a silver-containing region. FIG. 12 is a graph showing the Ge element distribution in the depth direction from the surface side in the lamination direction to the anchor metal diffusion control layer in Sample 11 and Comparative Sample 11 obtained by XPS. The excavation was performed by $Ar^+$ sputtering, and elemental analysis in the depth direction was performed. In FIG. 12, the horizontal axis 0 is the surface position of the laminate.

As shown in FIG. 12, it is found that in a case where $HfO_2$ is used for the anchor metal diffusion control layer, a region in which the amount of Ge, which is an anchor metal, increases is provided at the interface region between the silver-containing region and the anchor metal diffusion control layer, and thus an anchor region is formed. On the other hand, it is found that in a case where $SiO_2$ is used for the anchor metal diffusion control layer, the amount of Ge is decreased at the interface between the silver-containing region and the anchor metal diffusion control layer and most of Ge of the anchor metal layer formed on the anchor metal diffusion control layer is moved to the surface side of the silver-containing metal layer.

From the result, it was confirmed that $HfO_2$ having a high Hamaker constant could effectively suppress the diffusion of Ge. It is presumed that since the diffusion of Ge is suppressed, the function as an anchor region to suppress the granulation of the silver-containing metal layer by the anchor metal is maintained, and the flattening of the silver-containing metal layer can be realized.

What is claimed is:

1. A laminated film comprising:
    a resin substrate;
    an organic/inorganic multilayer in which an organic layer and an inorganic layer are alternately laminated; and
    a silver-containing metal layer having a thickness of 20 nm or less,
    wherein the resin substrate, the organic/inorganic multilayer, and the silver-containing metal layer are laminated in this order,
    a layer of the organic/inorganic multilayer on a side closest to the silver-containing metal layer is an inorganic layer,
    an anchor metal diffusion control layer having a Hamaker constant of $7.3 \times 10^{-20}$ J or more is provided on a surface of the inorganic layer,
    an anchor region containing an oxide of an anchor metal having a surface energy, which has a smaller difference with a surface energy of the silver-containing metal layer than a surface energy of the anchor metal diffusion control layer, is provided between the anchor metal diffusion control layer and the silver-containing metal layer, and
    a cap region containing an oxide of the anchor metal is provided on a surface of the silver-containing metal layer that is opposite from a surface on a side closer to the anchor metal diffusion control layer.

2. The laminated film according to claim 1,
    wherein the anchor metal diffusion control layer includes a metal oxide, a metal nitride, a metal oxynitride or a metal carbide.

3. The laminated film according to claim 2,
    wherein the anchor metal diffusion control layer contains a Hf oxide.

4. The laminated film according to claim 1,
    wherein, in the anchor region, a content ratio of the oxide of the anchor metal is larger than a content ratio of a non-oxidized anchor metal.

5. The laminated film according to claim 1,
    wherein the anchor metal is Ge, Si, Sn, In, Cu, Ga, or Zn.

6. The laminated film according to claim 1,
    wherein the silver-containing metal layer has a thickness of 10 nm or less.

7. The laminated film according to claim 1,
    wherein the organic/inorganic multilayer is a gas barrier layer.

8. A method for producing a laminated film including a resin substrate, an organic/inorganic multilayer in which an organic layer and an inorganic layer are alternately laminated, an anchor metal diffusion control layer, and a silver-containing metal layer having a thickness of 20 nm or less, which are laminated in this order, the method comprising:
    preparing a film in which an organic/inorganic multilayer whose outermost surface is an inorganic layer, serving as the organic/inorganic multilayer, is provided on the resin substrate;
    forming an anchor metal diffusion control layer having a Hamaker constant of $7.3 \times 10^{-20}$ J or more on the outermost surface;
    forming an anchor metal layer formed of an anchor metal having a surface energy, which has a smaller difference with a surface energy of the silver-containing metal layer than a surface energy of the anchor metal diffusion control layer, on the anchor metal diffusion control layer;
    forming the silver-containing metal layer on the anchor metal layer;
    exposing a laminate in which the organic/inorganic multilayer, the anchor metal diffusion control layer, the anchor metal layer, and the silver-containing metal layer are laminated on the resin substrate to a water vapor atmosphere and performing oxidation treatment of the anchor metal using oxygen molecules and water as reactive species; and
    producing a laminated film including an anchor region containing an oxide of the anchor metal between the anchor metal diffusion control layer and the silver-containing metal layer, and a cap region containing an oxide of the anchor metal on a surface of the silver-containing metal layer that is opposite from the anchor metal diffusion control layer.

9. The method for producing a laminated film according to claim 8,
    wherein a water vapor amount in the water vapor atmosphere is 100 g/m³ or more.

10. The method for producing a laminated film according to claim 8,
    wherein a temperature of the water vapor atmosphere is 100° C. or lower.

11. The method for producing a laminated film according to claim 9,
   wherein a temperature of the water vapor atmosphere is 100° C. or lower.

* * * * *